(12) United States Patent
Gyotoku et al.

(10) Patent No.: US 6,195,142 B1
(45) Date of Patent: Feb. 27, 2001

(54) ORGANIC ELECTROLUMINESCENCE ELEMENT, ITS MANUFACTURING METHOD, AND DISPLAY DEVICE USING ORGANIC ELECTROLUMINESCENCE ELEMENT

(75) Inventors: Akira Gyotoku, Saga; Hideaki Iwanaga, Fukuoka; Shintaro Hara, Fukuoka; Takahiro Komatsu, Fukuoka; Kei Sakanoue, Fukuoka, all of (JP)

(73) Assignee: Matsushita Electrical Industrial Company, Ltd., Osaka (JP)

( * ) Notice: Subject to any disclaimer, the term of this patent is extended or adjusted under 35 U.S.C. 154(b) by 0 days.

(21) Appl. No.: 08/773,732

(22) Filed: Dec. 24, 1996

(30) Foreign Application Priority Data

Dec. 28, 1995 (JP) .................................................. 7-342827
Jul. 24, 1996 (JP) .................................................. 8-194277
Aug. 30, 1996 (JP) .................................................. 8-230022

(51) Int. Cl.[7] .......................... G02F 1/1335; H05B 33/14
(52) U.S. Cl. ............................................. 349/69; 313/504
(58) Field of Search ................................ 349/69, 70, 71; 313/498, 499, 502, 503, 504, 511, 512, 505, 506, 509; 345/76

(56) References Cited

U.S. PATENT DOCUMENTS 5,427,858 * 6/1995 Nakamura et al. ................... 313/512
5,748,271 * 5/1998 Hikmet et al. ........................ 349/69

FOREIGN PATENT DOCUMENTS 5-89959    4/1993  (JP) .

* cited by examiner

Primary Examiner—William L. Sikes
Assistant Examiner—Tai V. Duong
(74) Attorney, Agent, or Firm—McDermott, Will & Emery

(57) ABSTRACT

The invention presents an organic electroluminescence element excellent in long-term durability and reliability, a manufacturing method excellent in mass producibility, and a display device using the organic electroluminescence element. Accordingly, to prevent growth of dark spots in the luminous layer by completely shutting off invasion of moisture or oxygen into an anode or an organic thin film layer, a shield material is adhered to an element by using low melting glass or low melting solder. To fuse the low melting glass or low melting solder used for this purposes, laser or ultrasonic wave is used. The surface of the element is sealed with a protective film in a film thickness of 3 microns to 30 microns, or a protective film composed of two-layer laminate film of insulating compound layer andmetal film. According to these inventions, a highly reliable organic electroluminescence element small in changes in the time course suchas growth of dark sports and lowering of luminance is obtained.

27 Claims, 17 Drawing Sheets

ORGANIC ELECTROLUMINESCENCE ELEMENT, ITS MANUFACTURING METHOD, AND DISPLAY DEVICE USING ORGANIC ELECTROLUMINESCENCE ELEMENT

BACKGROUND OF THE INVENTION

The present invention relates to an organic electroluminescence element used in light emitting element or the like applied in various display devices, light source or backlight of display device, or optical communication appliances, its manufacturing method, and displaying device using an organic electroluminescence element.

An electroluminescence element is a light emitting device making use of electric field light emission of solid fluorescent substance or phenomenon called electroluminescence, and at the present an inorganic electroluminescence element using an inorganic material as luminous body is practically used, and it is applied in the backlight of liquid crystal display, flat display, etc. However, the inorganic electroluminescence element requires alternating current and a high voltage of over 100 V in order to illuminate the element, and blue color light emission is difficult, and it is hence difficult to realize full color of R, G, B, that is, three primaries of red, green and blue.

On the other hand, the research about electroluminescence element using organic material has been long attempted, but the efficiency is very poor, and only low luminance is obtained, and it is far from practical study. However, the structure proposed by C. W. Tang et al. of Kodak in 1987, that is, the organic electroluminescence element having a laminate structure of function separate type dividing the organic substance into two layers of hole transfer layer and luminous layer 5 realized a high luminance light emission of over 1000 cd/m$^{-2}$ in spite of low voltage of 10 V or less (C. S. Tang and S. A. Vanslyke: Appl. Phys. Lett, 51 (1987) 913), where cd is an abbreviation of candela. Then the attention has been turned to the organic electroluminescence, and the laminate type organic electroluminescence elements having similar structure have been intensively studied recently.

The composition of a conventional organic thin film electroluminescence element is briefly described in FIG. 14.

In FIG. 14, an electroluminescence element is composed of a substrate 61, an anode 62, an organic thin film layer 63, a hole transfer layer 64, a luminous layer 65, and a cathode 66.

As shown in FIG. 14, a conventional organic electroluminescence element comprises a transparent or translucent substrate 61 of glass or the like, an anode 62 made of a transparent conductive film such as ITO formed on the substrate 61 by sputtering method, vapor deposition method or the like, a hole transfer layer 64 made of TPD formed on the anode 62 by vapor deposition method or the like, that is, N,N'-diphenyl-N,N'-bis(3-methyl phenyl)-1,140-diphenyl-4,4'-diamine (hereinafter called TPD), a luminous layer 65 formed on the hole transfer layer 64 by vapor deposition method or the like, being composed of 8-hydroxy quinoline aluminum (hereinafter called Alq3) or the like, and a cathode 66 made of metal film or the like formed on the luminous layer 65 by vapor deposition method or the like.

In the organic electroluminescence element shown in FIG. 14, an organic thin film layer 63 is composed of the hole transfer layer 64 and luminous layer 65.

Using the anode 62 of the organic electroluminescence element having such constitution as the positive electrode and the cathode 66 as the negative electrode, when a direct-current voltage or direct-current current is applied, holes are injected into the luminous layer 65 from the anode 62 through the hole transfer layer 64, and electrons are injected into the luminous layer 65 from the cathode 66. In the luminous layer 65, re-bonding of holes and electrons takes place, and hence the produced exciters are moved from the excited state to the basal state, and a luminous phenomenon occurs at this time. By varying the laminate structure for composing the organic thin film layer 63 or the material used in the luminous layer 65, the luminous wavelength can be changed. To enhance the luminous characteristic of such organic electroluminescence element, so far, (1) improvement of composition of the organic thin film layer 63 such as luminous layer 65 and hole transfer layer 64 or organic material used for them, or (2) improvement of material used for the anode 62 or cathode 66 had been studied.

For example, as for (2), in order to lower the barrier of the cathode 66 and luminous layer 65 for the ease of injection of electrons into the luminous layer 65, the Mg—Ag alloy was proposed in U.S. Pat. No. 4,885,211, or the material of small work function and high electric conductivity such as Al—Li alloy was disclosed in Japanese Laid-open Patent 5-121172, and these materials are widely employed at the present.

However, such alloy materials are high in activity and unstable chemically, they are corroded or oxidized by reaction with moisture or oxygen in the air. Such corrosion or oxidation of the cathode 66 causes to grow extremely the non-luminous area called dark sports existing in the luminous layer 65, which is a cause of transitional deterioration of characteristic in the organic electroluminescence element.

Not limited to the cathode 66, yet, the organic material used in organic thin film layer 63 such as luminous layer 65 and hole transfer layer 64 also changes in structure generally by reaction with moisture or oxygen, which may also give rise to growth of dark spots.

Therefore, to enhance the durability and reliability of organic electroluminescence element, it is necessary to seal the entire organic electroluminescence element in order to prevent reaction of the material used in the cathode 66 or organic thin film layer 63 with moisture or oxygen.

For sealing of the organic electroluminescence element, mainly two methods have been studied so far. One is to form a protective film on the outer surface of the organic electroluminescence element by using vacuum film forming technology such as vapor deposition method, and other is to adhere a shield material 8 made of glass cap or the like to the organic electroluminescence element.

The method of sealing the organic electroluminescence element by forming a protective film is disclosed, for example, in Japanese Laid-open Patent 6-96858, which relates to a method of forming GeO, SiO, AlF3, or the like on the outer surface of the organic electroluminescence element by ion plating method. In Japanese Laid-open Patent 7-211455, a method of forming a protective film composed of a moisture absorbing material with moisture absorption of 1% or more and a moisture-proof material with moisture absorption of 0.1% or less is disclosed.

As the method of sealing the organic electroluminescence element by adhering a shield material, as already employed in the inorganic electroluminescence element, a method of installing a glass plate outside of the back electrode and filling the space between the back electrode and glass plate with silicone oil is known. Besides, Japanese Laid-open Patent 5-089959 discloses a method of shielding by electric insulating glass or electric insulating airtight fluid after forming a protective film composed of insulating inorganic compound. In the case of shielding by electric insulating airtight fluid, a method of filling a glass container or the like with inert gas or silicone oil, and sealing the opening with epoxy resin is presented.

The present inventors investigated growth of dark spots from various viewpoints, and discovered that growth of dark spots is promoted even by trace of moisture existing in the vacuum of, for example, $10^{-4}$ Torr.

Causes of occurrence of dark spots originate mainly from contamination on the anode such as ITO film and dust deposits on the substrate 61. In the case of ITO film, its surface contamination can be nearly eliminated by devising a proper cleaning method, but it is difficult to completely eliminate dust deposits on the substrate 61. For example, if the organic electroluminescence element is manufactured on a clean room, even in a clean room of class 100, one dust particle of about 3 microns is present in 10 liters. Also multiple dust particles are present in the vapor deposition apparatus used in the manufacturing process, or dust may deposit on the substrate 61 when forming a film. Therefore, if working in a clean room of an advanced degree of cleanliness, dust is present on the substrate 61 at a considerably high rate, and it is extremely difficult to prevent completely generation of dark spots.

In addition, since dark spots are caused by dust particles of several microns existing on the substrate 61, in the conventional organic electroluminescence element composed of organic thin film layer 63 of about 0.1 micron, cathode 66 of about 0.2 micron, and protective film of about 0.5 micron formed thereon, the total film thickness is about 1 micron, and dust cannot be concealed completely. Therefore, if the protective film itself is completely impermeable not to pass oxygen or moisture, unless the dust is completely covered by the protective film, oxygen or moisture may invade into the organic thin film 63 or cathode 66 from the surrounding of dust, so that dark spots may be grown.

Hence, to eliminate growth of dark spots completely, it is necessary to shut off nearly completely invasion of moisture or oxygen into the material used in the cathode 66 or organic thin film layer 63.

Incidentally, as for the organic material used in the organic electroluminescence element, the upper limit of the heating temperature allowed in the manufacturing process is about 100° C. Therefore, this temperature cannot be exceeded if forming protective film by vapor deposition method or the like, but as for the oxide film such as GeO, SiO, and $SiO_2$ used as protective film, it is hard to form a sufficiently dense film at low temperature of about 100° C. generally, and in such film forming condition, multiple defects and pin holes are present in the film, and moisture and oxygen cannot be shut off completely. If attempted to solve these problems by increasing the film thickness, the internal stress of the protective film increases as the film thickness increases, the damages are given to the cathode 66 or organic thin film layer 63, which may possibly lead to lowering of light emitting luminance or short-circuit of the organic electroluminescence element.

Besides, sealing by shield material hitherto attempted has not completely suppressed growth of dark spots. The epoxy resin used in adhesion with the electric insulating glass substrate mentioned in the above Japanese Laid-open Patent 5-089959 generally has a steam permeability if about 3 to 5 $(g/m^2 \cdot 24$ h/mm), or polyimide resin, about 2 $(g/m^2 \cdot 24$ h/mm), and hence invasion of water from the adhesion portion cannot be suppressed completely.

Thus, by the protective film or adhesion by glass cap used hitherto in the organic electroluminescence element, it was impossible to completely suppress growth of dark sports.

SUMMARY OF THE INVENTION

The invention is intended to solve the above problems, and it is hence an object of the invention to present an organic electroluminescence element capable of preventing growth of dark spots in the luminous layer by completely shutting off invasion of moisture or oxygen into the cathode or organic thin film layer, present a manufacturing method of organic electroluminescence element capable of forming shield materials for completely shut off invasion of moisture or oxygen to the cathode or organic thin film layer easily and mass producibly, and present a display device excellent in durability and reliability preventing growth of dark spots on the organic electroluminescence element.

The invention presents an organic electroluminescence element having an organic thin film layer formed between the cathode and anode, and the organic electroluminescence element of the invention is characterized by using low melting glass or low melting solder in adhesion of the shield portion for shutting off moisture and oxygen and the substrate on which the element is formed. To fuse the low melting glass or low melting solder used therein, laser or ultrasonic wave is used. The invention therefore brings about an organic electroluminescence element of high reliability small in time course changes such as growth of dark spots and lowering of luminance.

Moreover, the invention relates to a laminate structure comprising a substrate, and an anode, an organic thin film and a cathode laminated on the substrate, and a protective film is formed on the outer surface of the laminate structure, and the outer surface of the organic thin film and cathode is sealed with (a) a protective film of 3 to 30 microns in film thickness, or (b) a protective film of laminate film of two layers or more having an insulating compound layer at least in the lowest layer. In this constitution, invasion of moisture or oxygen into the cathode or organic thin film is completely shut off, growth of dark spots on the luminous layer is prevented, thereby presenting an organic electroluminescence element capable of suppressing gradual decline of light emitting luminance.

The organic layer of the organic electroluminescence element is inferior in heat resistance, and therefore in the conventional method of adhering the shield portion by heating the entire element nearly to 500° C. by putting into a furnace, the element characteristic is spoiled. By contrast, according to the manufacturing method of the invention, it is possible to adhere without breaking the organic thin film layer.

The invention also relates to a display device in the constitution of using the organic electroluminescence element of the invention as the backlight or display unit, so that the display device excellent in durability and reliability may be obtained.

In the invention, the phrase of low melting glass means low melting point glass, and low melting solder means low melting point solder.

DETAILED DESCRIPTION OF THE INVENTION

An embodiment of the invention is described below by referring to FIG. 1.

Figure 1:
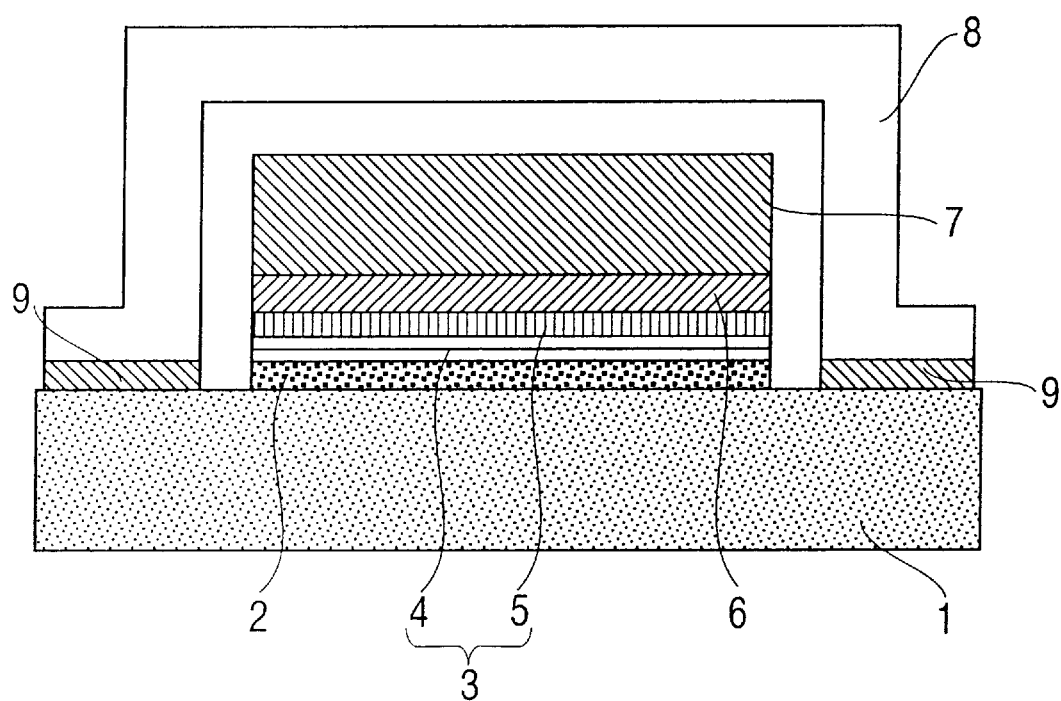
FIG. 1 is a sectional view showing a typical structure of an organic electroluminescence element in an embodiment of the invention.

FIG. 1 is a schematic sectional view of an organic electroluminescence element in an embodiment of the invention. In FIG. 1, the organic electroluminescence element is composed of a laminate structure formed of a substrate 1, an anode 2 disposed on the top surface of the substrate 1, an organic thin film layer 3 disposed on the substrate 1 and anode 2, a cathode 6 disposed on the top surface of the organic thin film layer 3, and a protective layer 7 disposed to cover the cathode 6 and organic thin film layer 3, and a shield material 8 disposed on the surface of the substrate to cover the outer surface of the laminate structure. In particular, the shield material 8 and substrate 1 are adhered through an adhesive layer 9.

The substrate 1 is made of transparent or translucent glass, PET (polyethylene terephthalate), polycarbonate, amorphous polyolefin, or the like. The substrate 1 may be also a flexible substrate 1 having flexibility in a thin film of such materials.

The anode 2 is installed in a specified pattern shape, and is formed of ITO, ATO (Sb doped $SnO_2$), AZO (Al doped ZnO), etc.

The organic thin film layer 3 may be a single layer structure of luminous layer 5 only, a two-layer structure of a hole transfer layer 4 and luminous layer 5, or luminous layer 5 and electron transfer layer, or a three-layer structure of hole transfer layer 4, luminous layer 5, and electron transfer layer. In the case of such two-layer structure or three-layer structure, however, the hole transfer layer 4 and anode 2, or electron transfer layer and cathode 6 are formed so as to laminate mutually.

The luminous layer 5 is preferred to have a fluorescent characteristic in the visible region, being made of a fluorescent material of excellent film forming property, of which examples include, aside from Alq3 and Be-benzoquinolinol (BeBq2), 2,5-bis(5,7-di-t-benzyl-2-benzoxazolyl)-1,3,4-thiadiazole, 4,4'-bis(5,7-benzyl-2-benzoxazolyl)stilbene, 4,4'-bis[5,7-di-(2-methyl-2-butyl)-2-benzoxazolyl)stilbene, 2,5-bis(5,7-di-t-benzyl-2-benzoxazolyl)thiophine, 2,5-bis ([5-α,α-dimethyl benzyl]-2-benzoxazolyl)thiophene, 2,5-bis[5,7-di-(2-methyl-2-butyl)-2-benzoxazolyl]-3,4-diphenyl thiophene, 2,5-bis(5-methyl-2-benzoxazolyl)thiophene, 4,4'-bis(2-benzoxazolyl)biphenyl, 5-methyl-2-[2-[4-(5-methyl-2-benzoxazolyl)phenyl]vinyl]benzoxazolyl, 2-[2-(4-chlorophenyl)vinyl]naphtho[1,2-d]oxazole, other benzoxaxole system, 2,2'-(p-phenylene divinylene)bisbenzothiazole, other benzothiazole system, 2-[2-[4-(2-benzoimidazolyl) phenyl]vinyl]benzoimidazole, 2-[2-(4-carboxyphenyl) vinyl]benzoimidazole, other benzoimidazole system, and other fluorescence brightener, tris(8-quinolinol)aluminum, bis(8-quinolinol)magnesium, bis(benzo[f]-8-quinolinol) zinc, bis(2-methyl-8-quinolinolate)aluminum oxide, tris(8-quinolinol)indium, tris(5-methyl-8-quinolinol)aluminum, 8-quinolinol lithium, tris(5-chloro-8-quinolinol)gallium, bis (5-chloro-8-quinolinol)calcium, poly[zinc-bis(8-hydroxy-5-quinolinol)methane], other 8-hydroxy quinoline metal complex, dilithium epindridion, other metal chelate oxide compound, 1,4-bis(2-methyl styryl)benzene, 1,4-(3-methyl styryl)benzene, 1,4-bis(4-methyl styryl)benzene, distyryl benzene, 1,4-bis(2-ethyl styryl)benzene, 1,4-bis(3-ethyl styryl)benzene, 1,4-bis(2-methyl styryl) 2-methyl benzene, other styryl benzene compound, 2,5-bis(4-methyl styryl) pyrazine, 2,5-bis(4-ethyl styryl)pyrazine, 2,5-bis[2-(1-naphthyl)vinyl]pyrazine, 2,5-bis(4-methoxy styryl) pyrazine, 2,5-bis[2-(4-biphenyl)vinyl]pyrazine, 2,5-bis[2-(1-pyrenyl)vinyl]pyrazine, other distyl pyrazine derivative, naphthalimide derivative, perylene derivative, oxadiazole derivative, aldazine derivative, cyclopentane diene derivative, styryl amine derivative, courmarine derivative, and aromatic dimethyldine derivative. Further, anthracene, salicylate, pyrene, coronen, etc. May be also used.

The material for the hole transfer layer 4 is preferably high in hole mobility, transparent, and excellent in film forming property, which may include, aside from tri-phenyl di-amine derivative like TPD, porphin, tetraphenyl porphin copper, phthalocyanine, copper phthalocyanine, titanium phthalocyanine oxide, other porphyrin compound, 1,1-bis [4-(di-P-trylamino)phenyl]cyclohexane, 4,4',4"-trimethyl triphenyl amine, N,N,N',N'-tetraxis (P-tolyl)-P-phenylene diamine, 1-(N,N-di-P-tolylamino)naphthalene, 4,4'-bis (dimethyl amino)-2,2'-dimethyl triphenyl methane, N,N,N', N'-tetraphenyl-4,4'-diaminobiphenyl, N,N'-diphenyl-N,N'-di-m-tolyl-4, N,N-diphenyl-N,N'-bis(3-methyl phenyl)-1,1'-4-,4'-diamine, 4'-diaminobiphenyl, N-phenyl carbazole, other aromatic tertiary amine, 4-di-P-tolylamino stilbene, 4-(di-P-tolylamino)-4'-[4-(di-P-tolylamino)styryl]stilbene, other stilbene compound, triazole derivative, oxadiazole derivative, imidazole derivative, polyaryl alkane derivative, pyrazoline derivative, pyrazolone derivative, phenylene diamine derivative, anyl amine derivative, amino substituent chalcone derivative, oxazole derivative, styryl anthracene derivative, fluorenone derivative, pydrazone derivative, silazane derivative, polysilane aniline copolymer, macromolecular oligomer, styryl amine compound, aromatic dimethylidine compound, poly-3-methyl thiophene, and other organic material. Also a macromolecular dispersion system of organic material for hole transfer layer 4 of low molecular weight dispersed in high polymer of polycarbonate or the like may be used as the hole transfer layer 4.

The material for the electron transfer layer includes 1,3-bis(4-tert-butyl phenyl-1,3,4-oxadiazolyl)phenylene (OXD-7), other dioxadiazole derivative, anthraquinone dimethane derivative, diphenyl quinone derivative, and others.

The cathode 6 is installed in a specified pattern form, and is composed of Al, In, Mg, Ti, other metal, Mg—Ag alloy, Mg—In alloy, other Mg alloy, Al—Li alloy, Al—Sr alloy, Al—Ba alloy, other Al alloy, and others.

As the protective layer 7, an insulating compound layer is used, for example, GeO, SiO, $SiO_2$, $MoO_3$, other oxide, AlN, $Si_3N_4$, other nitride, PET, or other thermoplastic organic high polymer, and GeO is particularly preferred.

Figure 15:
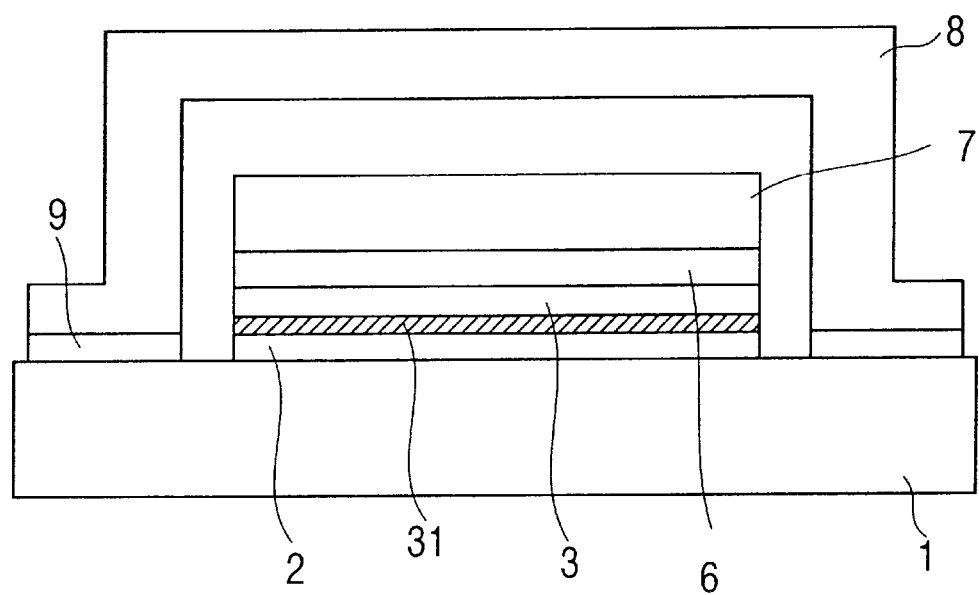
FIG. 15 is a sectional view showing another structure of an organic electroluminescence element in an embodiment of the invention.

In the invention, as shown in FIG. 15, carbon layer 31 can be deposited between the anode 2 and the organic thin film layer 3. By this structure, the carbon layer 31 can increase the adhesive force between the anode 2 and the organic thin film layer 3 and improve the reliability such as preventing the occurrence of dark spots.

In the invention, when the electroluminescence element is used as the illuminating device, the cathode 6 and anode 2 are installed in a shape suited to the shape of illumination, and when voltage or current is applied to the cathode 6 and anode 2, the portion of the organic thin film layer matching with the shape of these electrodes emits light. When the electroluminescence element is used as dot matrix type display device, the anode possesses plural wire electrodes in the X-direction, the cathode possesses plural wire electrodes in the Y-direction orthogonal to the X-direction, and when voltage or current is applied, the organic thin film in the dot portion at the intersection emits light.

It is one of the features of the invention the shield material 8 of stainless steel or glass is used and is adhered to the substrate 1 with an adhesive layer 9 of low melting glass or low melting solder to seal the organic thin film layer EL element. Examples of the low melting glass include Pb—B—Sn—Si—Al—O system T187 and Sn—P—Pb—O—F system low melting glass , Pb—Sn—P—O—Cl system low melting glass (L. Hu & Z. Jiamg Phys. Chem. Glasses 35 (1993) 38), and PbO—SnO&13 P2O5 system low melting glass.

Figure 16:
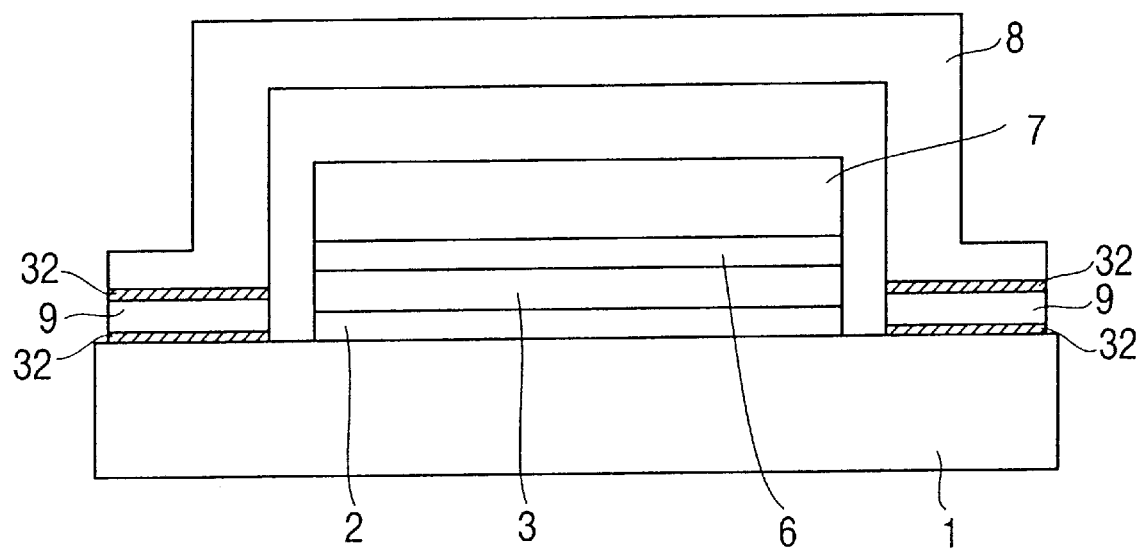
FIG. 16 is a sectional view showing still another structure of an organic electroluminescence element in an embodiment of the invention.

Or, the shield material 8 and the substrate 1 on which the organic electroluminescence element is formed may be directly adhered with low melting glass, and to improve further the wettability with the low melting glass, for example, a buffer layer 32 of $SiO_2$, SiO or the like may be formed in at least one of substrate 1 and shield material 8. This structure is shown in FIG. 16.

As the adhesive layer 9 between the shield material 8 and substrate 1, nearly same effects are confirmed by using, aside from low melting glass, liquid crystal polymer having a far excellent moisture resistance as compared with epoxy resin, polyimide resin, and other macromolecular adhesives. The liquid crystal polymer used in the invention is a rigid high polymer in a rod shape, mostly having a skeleton of aromatic polyester, but also amide bond or ether bond may be included. The detail is described in a feature article in High Polymer, October 1994, edited by Japan Society of High Polymer. The liquid crystal high polymer is hardly changed in structure when solidified, and is known for merits such as fast solidifying speed, small shrinkage, and high gas barrier performance, and is initially developed by Carborundum, Kodak, Hoechst Celanese and others, and is distributed by many manufacturers in the tradenames of Bectran, Rodran, Zider, etc. These products are, however, only in the initial stage of application in injection molding, textile and film, and nothing has been specifically studied for use in resin adhesive for sealing the organic electroluminescence as in the invention, and optimum method of use and effects could not be predicted. The inventors accumulated intensive studies, and obtained effects more than expected beyond the performance of the conventional resin when used as sealing resin of organic electroluminescence.

The structure of the organic electroluminescence element manufactured by the invention is not particularly defined, and aside from the structure of anode 2/hole transfer layer 4/luminous layer 5/cathode 6 mentioned above, other structures are possible, for example, a single layer type device of anode 2/luminous layer 5/cathode 6, two-layer structure of anode 2/luminous layer 5/electron transfer layer/cathode 6, and three-layer structure of anode 2/hole transfer layer 4/luminous layer 5/electron transfer layer/cathode 6.

The reliability may be further enhanced by controlling the film thickness of the insulating compound layer as the protective layer 7, in particular, by laminating a metal conductive film on the protective layer 7.

In the invention, meanwhile, the anode 2 is formed on the substrate 1 in a specific pattern, and the anode 2 has a lead portion to be connected to outside, and through this lead portion, the shield material 8 and substrate 1 are adhered through the adhesive layer 9.

Figure 5:
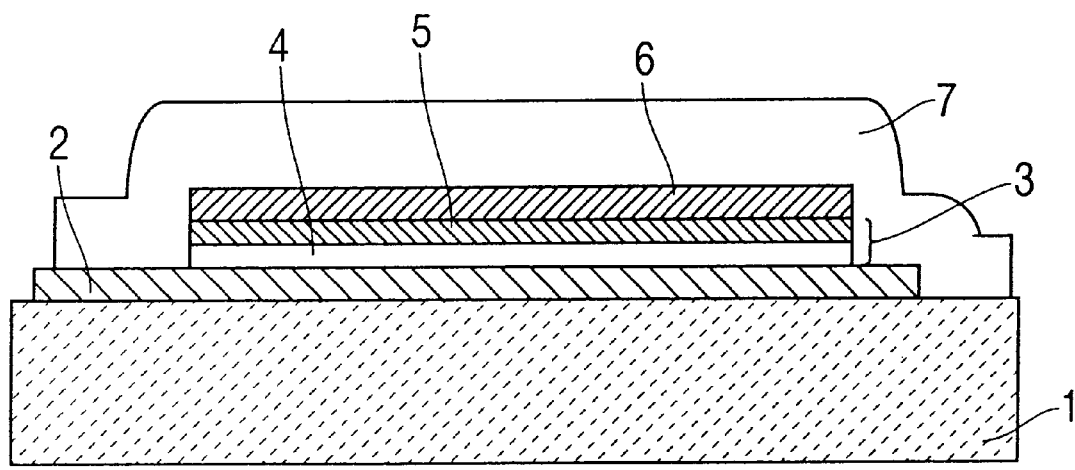
FIG. 5 is a sectional view showing a typical structure of an organic electroluminescence element in an embodiment of the invention.

FIG. 5 is an essential sectional view of an organic electroluminescence element in other embodiment of the invention.

In FIG. 5, reference numeral 7 denotes a protective layer, and the substrate 1, anode 2, organic thin film layer 3, hole transfer layer 4, luminous layer 5, and cathode 6 are same as mentioned above, and are identified with same reference numerals and description is omitted.

What the organic electroluminescence element of the embodiment differs from the prior art lies in that a protective layer 7 of 3 microns to 30 microns in film thickness is formed on the substrate 1, and by this protective layer 7, the outer surface of at least the organic thin film layer 3 and cathode 6 is sealed to shut off completely invasion of moisture or oxygen into the organic thin film layer 3 or cathode 6.

The operation of the organic electroluminescence element of the embodiment having such constitution is same as in the prior art and description is omitted.

Thus, according to the embodiment, by completely shutting off invasion of moisture or oxygen into the cathode 6 or organic thin film layer 3 by the protective layer 7 of 3 microns to 30 microns in film thickness, it is possible to prevent growth of dark spots in the luminous layer 5.

The protective layer 7 of the embodiment may be either single layer film or a laminate film of two layers or more. In the case of laminate film, it is preferred to form a laminate film of two layers or more having an insulating compound layer at least in the lowest layer, and in particular in the case of a two-layer structure of an insulating compound layer and a metal film formed on the insulating compound layer, the protective film can be formed easily and transitional decline of luminance of light emission can be suppressed. As the metal layer, Ag, In, Cu, Al, Cr, Fe or other metal, and Ni—Fe, Fe—Cr, or other alloy may be used. In particular, as the material capable of effectively preventing growth of dark spots and transitional decline of luminance of light emission, Ag or In is preferred.

Figure 6:
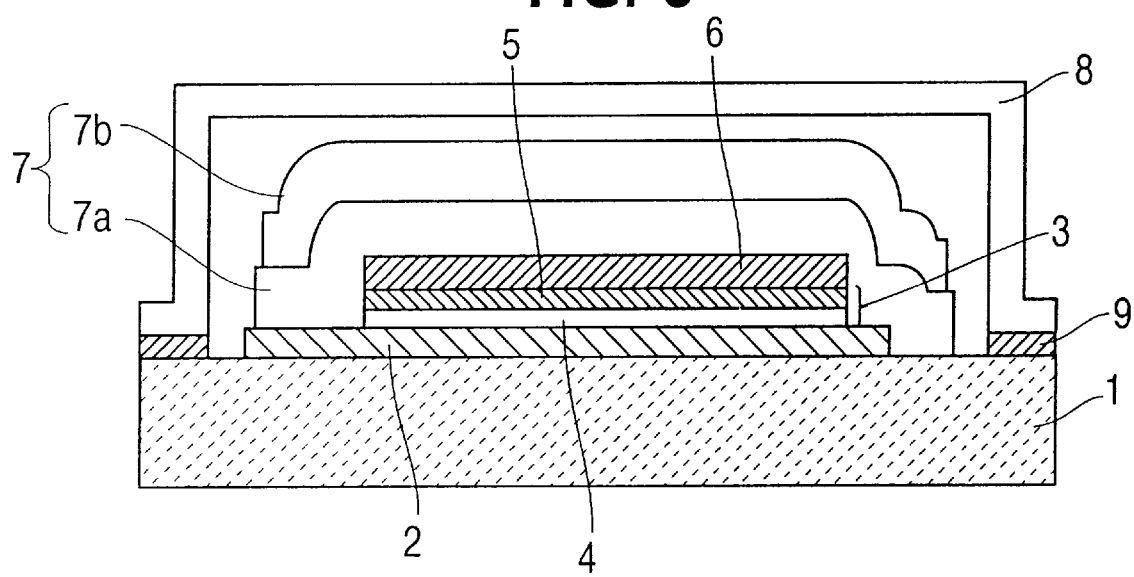
FIG. 6 is a sectional view showing a typical structure of an organic electroluminescence element in an embodiment of the invention.

FIG. 6 is an essential sectional view of an organic electroluminescence element in a different embodiment of the invention.

In FIG. 6, reference numeral 7 is a protective layer, 7a is a lowest layer, 7b is an upper layer, 8 is a glass cap as shield material, and 9 is a sealing layer, and the substrate 1, anode 2, organic thin film layer 3, hole transfer layer 4, luminous layer 5, and cathode 6 are same as above.

What the organic electroluminescence element of the embodiment differs from the first embodiment lies in that the protective layer 7 formed on the substrate 1 is a laminate film of at least two layers or more having a lowest layer 7a of an insulating compound, and an upper layer 7b formed on the lowest layer 7a, and that a glass cap 8 sealed by a sealing layer 9 is provided on the substrate 1, so that invention of moisture or oxygen into the organic thin film layer 3 or cathode 6 is shut off completely by sealing the outer surface of at least the organic thin film layer 3 and cathode 6 by the protecting layer 7 and the glass cap 8.

The operation of the organic electroluminescence element of the embodiment having such constitution is same as in the prior art and description is omitted.

Thus, according to the embodiment, by completely shutting off invasion of moisture or oxygen into the cathode 6 or organic thin film layer 3 by the protective layer 7 of a laminate film of two layers or more having an insulating compound layer at least in the lowest layer and the glass cap 8, it is possible to prevent growth of dark spots in the luminous layer 5.

By the glass cap, moreover, damages of protective layer 7, cathode 6, organic thin film layer 3, and anode 2 by external factors can be prevented.

In the embodiment, by forming the protective layer 7 in a two-layer structure of an insulating compound layer and a metal film formed on the insulating compound layer, the protective layer 7 can be formed easily and transitional decline of luminance of light emission can be effectively prevented.

Also in the embodiment, the glass cap is adhered on the substrate 1, but the glass cap may be omitted. It is, however, preferred to adhere the glass cap on the substrate 1 because damages of protective layer 7, cathode 6, organic thin film layer 3, and anode 2 by external factors can be prevented, and growth of dark spots can be effectively suppressed.

The organic thin film layer 3 in the embodiment is a two-layer structure of hole transfer layer 4 and luminous layer 5, but the structure is not limited to this example alone as mentioned above.

A manufacturing method of an organic electroluminescence element in an embodiment of the invention is described below.

First, by known methods, an anode 2 made of ITO or the like, a hole transfer layer 4 made of TPD or the like, a luminous layer 5 made of Alq3 or the like, and a cathode 6 made of Al—Li alloy or the like are sequentially formed and laminated on a substrate 1 of glass or the like by resistance heating deposition method, ion beam sputtering method, etc. On the cathode 6, moreover, an insulating compound layer of GeO or the like may be formed.

Next, as a sealing process, a shield material 8 is adhered on the substrate 1 through low melting glass or low melting solder as an adhesive layer 9.

As the sealing method of shield material 8 by low melting glass or low melting solder, laser beam or ultrasonic wave may be used.

In the method of using laser beam, the shield material 8 adhered with low melting glass or low melting solder is fixed at a specified position on the substrate 1, and the laser beam is emitted to the sealing portion of the low melting glass, low melting solder, shield material 8, or substrate 1, and the low melting glass or low melting solder is fused to adhere the substrate 1 and shield material 8.

In the method of using an ultrasonic soldering apparatus, first the low melting solder is fused in the sealing portion of the shield material 8 and substrate 1 by the ultrasonic soldering apparatus to adhere, and the shield material 8 is fixed at a specified position on the substrate 1, then the low melting solder is fused again by the ultrasonic soldering apparatus to adhere the substrate 1 and shield material 8.

By using ultrasonic wave or laser beam, the substrate 1 and shield material 8 can be adhered in an extremely short time, and the heating temperature can be set low and limited in a local area, so that breakdown of the organic electroluminescence element can be prevented.

The series of manufacturing process from film forming to sealing is preferred to be performed continuously ideally in an atmosphere close to vacuum or filled with inert gas. Further specific examples are described below.

EXAMPLE 1

FIG. 1 is a block diagram of an organic electroluminescence element showing an embodiment of the invention. First, to form a specified pattern shape on a glass substrate 1 on which an ITO film is formed entirely, the ITO film 2 (film thickness 160 nm) is etched by using hydrochloric acid. This substrate 1 is cleaned ultrasonically for 5 minutes in a detergent (Semico Clean, Furuuchi Chemical), further cleaned ultrasonically for 10 minutes in purified water, and cleaned ultrasonically for 5 minutes in a solution of ammonia and hydrogen peroxide (1:1;5), finally cleaned ultrasonically for 5 minutes in purified water at a temperature of 70° C., and water is blown away by nitrogen blower, then it is heated and dried at a temperature of 250° C. Thus cleaned substrate 1 is set in a resistance heating deposition apparatus, the chamber is evacuated to a degree of vacuum of $2 \times 10^{-6}$ Torr or less, and a hole transfer layer 4 of about 500 angstroms is formed by using TPD as deposition source. In succession, using Alq3 as deposition source, a luminous layer 5 of about 750 angstroms is formed. The speed of deposition is not particularly defined, but it was performed at 2 angstroms/s in both operations. Next, in the same vacuum layer, using an AlLi alloy containing 15 at % of Li as deposition source, a cathode 6 is formed in a film thickness of 2000 angstroms. The substrate 1 on which this element was formed was taken out from the vacuum chamber, and a shield material 8 was formed outside of the element in the following procedure. Using SUS303 (Fe—Cr—Ni alloy) as the shield material 8, first, low melting glass was applied on the portion contacting with the substrate 1. The low melting glass was tradename T187 of Iwaki Glass, and after adjusting to the particle size of 300 meshes (43 microns or less), it was mixed with an organic binder having 1% of nitrocellulose blended in isoamyl acetate at a concentration rate of 12 (low melting glass) to 1 (organic binder) by weight, and the mixture was applied on the sealing area by using a brush. After application, in order to vaporize the solvent in the organic binder, it was dried for about 10 minutes at a temperature of 110° C. In succession, this seal material was heated for 15 minutes in an electric furnace at 450° C. to fuse the low melting glass, and it was taken out, and is overlaid on the glass substrate 1 on which the element was formed, and sealing was completed. Incidentally, when adhering the glass substrate 1 and shield material 8, it was performed on a copper plate of high thermal conductivity so that the temperature of the element might not be elevated, and the temperature rise of the element was suppressed. In this way, an organic electroluminescence element adhered with the shield material 8 by low melting glass was obtained.

EXAMPLE 2

First, in the same manner as in EXAMPLE 1, an organic electroluminescence element is fabricated up to the process before bonding of the shield material 8. Then, low melting glass of Sn—P—Pb—O—F system (Shoei Chemical Industries) ground to powder of 10 microns or less is mixed with methyl alcohol at a concentration rate of 1:1 by weight to form a paste, which is applied on a white sheet glass of 1 mm in thickness of HOYA to be used as shield material 8. In this white sheet glass, the portion confronting the forming portion of an organic electroluminescence element was drilled by 0.3 mm by sand blasting method. This can prevent breakage due to contact of the shield glass with the organic electroluminescence element. Instead of sand blasting method, honing method may be also employed. Next, to vaporize the organic solvent, after once heating for 10 minutes at 100° C., it is then heated for 10 minutes in an electric furnace at 300° C., and taken out and overlaid and adhered on the glass substrate 1 on which the element is formed. In this method, the organic electroluminescence element using glass in the shield material 8 is completed. The melting point of the low melting glass used herein is 270° C., but glass of any arbitrary melting point may be obtained by adjusting the composition.

EXAMPLE 3

Figure 4:
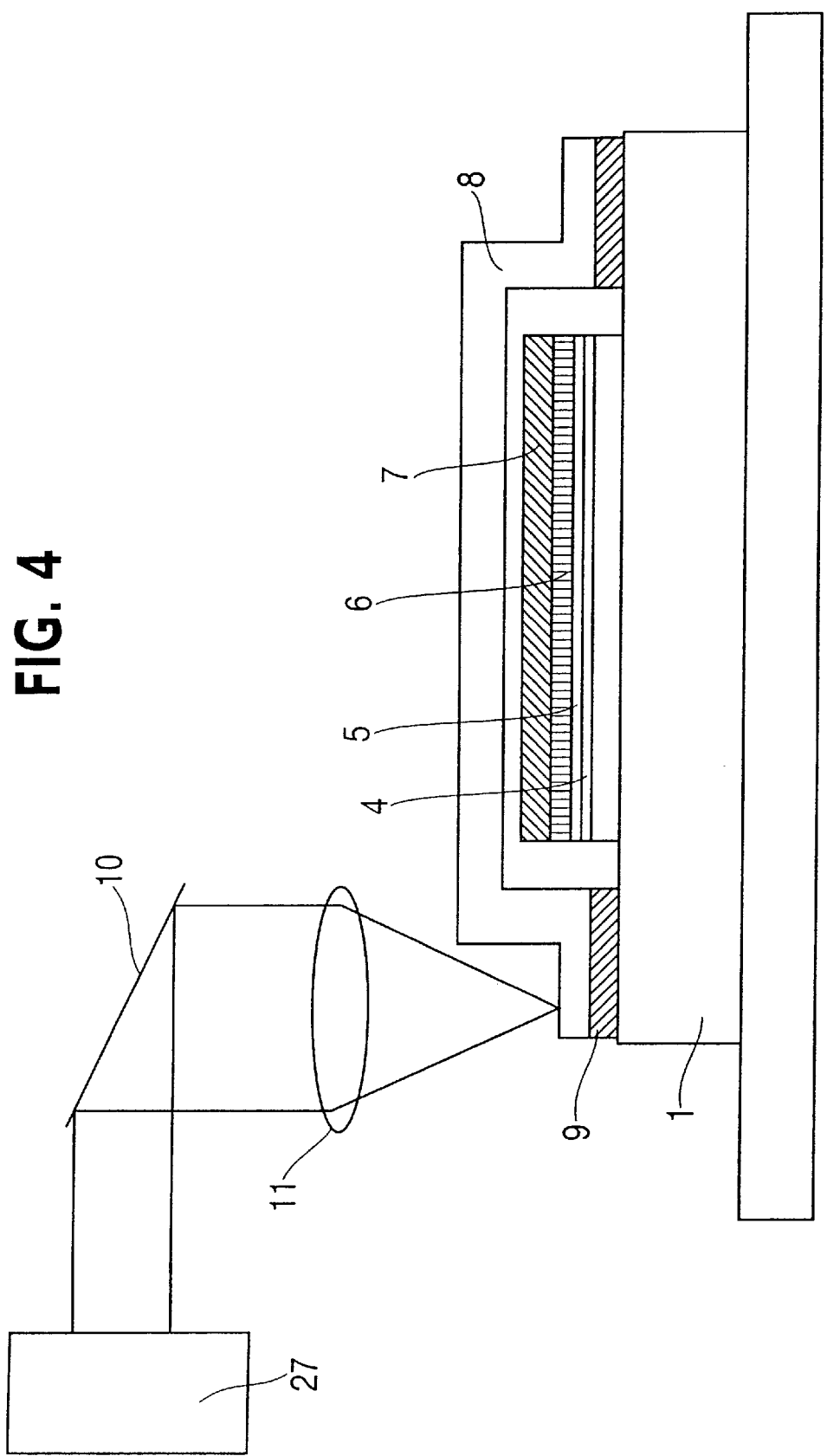
FIG. 4 is a sectional view showing a method of fusing low melting glass or low melting solder by using laser in an embodiment of the invention.

FIG. 4 shows an example of using YAG laser. After forming the element in the same manner as in EXAMPLE 1, low melting glass of Sn—P—Pb—O—F system or the like as adhesive layer 9 is applied on a white sheet glass as shield material 8 in the same manner as shown in EXAMPLE 1. The light emitted from the YAG laser 27 (model ML-2330A of Miyachi Technos) is refracted by a reflection mirror 10 and entered into a lens 11. The light condensed by the lens is applied from outside the shield material 8 while moving the element by an X—Y table, and the low melting glass is fused and adhered.

In this embodiment, an example of using YAG laser is presented, but other carbon dioxide laser or excimer laser may be also used. What is important is that the wavelength of each laser induces absorption with the shield substrate 1 or low melting glass 9 to fuse the low melting glass 9, and the material for the substrate 1, shield material 8, low melting glass 9 and laser may be selected accordingly. For example, when the low melting glass absorbs at the laser wavelength, the low melting glass itself is fused, and when the shield material 8 absorbs at the laser wavelength, the shield material 8 is warmed, and its heat is transmitted to the low melting glass to fuse, or when the substrate 1 on which the element is formed absorbs at the laser wavelength, it is warmed, and its heat is transmitted to the low melting glass 9 to fuse. Therefore, there is no particular limitation among the laser, low melting glass 9, substrate 1, and shield material 8.

Meanwhile, as a result of scanning of the applied portion of the low melting glass by condensed laser beam, if not diffused uniformly but particles are left over partly, there is no problem as far as the air tightness is maintained.

EXAMPLE 4

After forming an ITO film of 160 nm in film thickness on a glass substrate 1 by sputtering method, a resist material (OFPR-800 of Tokyo Oka) was applied on the ITO film by spin coating method, and a resist film of 10 microns in thickness was formed, and the resist film was patterned to a specified shape by masking, exposing and developing. This glass substrate 1 was immersed in 50% hydrochloric acid at 60° C., and the ITO film in the portion freefrom resist film was etched, and then the resist film was also removed, thereby obtaining a glass substrate 1 forming an anode 2 made of an ITO film of specified pattern.

This glass substrate 1 was cleaned ultrasonically for 5 minutes in a detergent (Semico Clean, Furuuchi Chemical), cleaned ultrasonically for 10 minutes in purified water, cleaned ultrasonically for 5 minutes in a solution of 1 part (by volume) of ammonia water, 1 part of hydrogen peroxide water, and 5 parts of water, and cleaned ultrasonically for 5 minutes in purified water at 70° C., sequentially, and moisture deposits on the glass substrate 1 were removed by nitrogen blower, and it was heated and dried at 250° C.

On the anode 2 side surface of the dried glass substrate 1, TPD was formed in a film thickness of about 50 nm as hole transfer layer 4 in a resistance heating deposition apparatus evacuated to a degree of vacuum of $2 \times 10^{-6}$ Torr or less.

Next, similarly in the resistance heating deposition apparatus, Alq3 was formed in a film thickness of about 75 nm as luminous layer 5 on the hole transfer layer 4. The deposition speed of both TPD and Alq3 was 0.2 nm/s.

Also in the resistance heating deposition apparatus, a cathode 6 was formed in a film thickness of 200 nm on the luminous layer 5, using an Al—Li alloy containing 15 at % of Li as deposition source.

In the resistance heating deposition apparatus, consequently, an insulating compound layer as protective layer 7 was formed in a film thickness of about 3 microns on the cathode 6, using GeO as deposition source.

The glass substrate 1 on which the insulating compound layer 7 was formed was taken out of the deposition apparatus, and in the sealing area of the shield material 8 made of white sheet glass (1 mm thick, HOYA) with the glass substrate 1, low melting solder (Serasolza No. 123, Asahi Glass) was applied by using an ultrasonic soldering apparatus (Sun Bonder USM-IV, Asahi Glass), in the condition of frequency of 50 kHz and heating temperature of 150° C., and the shield material 8 was fixed on the glass substrate 1, and the low melting solder depositing on the white sheet glass was fused again by the ultrasonic soldering apparatus in the condition of frequency of 50 Hz, heating temperature of 150° C., and vibrating time of 20 to 30 seconds, and then the glass substrate 1 and shield material 8 were sealed tightly.

In this method, an organic electroluminescence element was fabricated, which was presented as EXAMPLE 4.

EXAMPLE 5

Same as in the first embodiment, a glass substrate 1 was fabricated by laminating an anode 2 mode of ITO film, a hole transfer layer 4 made of TPD, a luminous layer 5 made of Alq3, a cathode 6 made of Al—Li alloy, and a protective layer 7 made of GeO.

The glass substrate 1 forming the protective layer 7 was taken out of the deposition apparatus, and in the sealing area of a shield material 8 made of white sheet glass (1 mm thick, HOYA) forming a recess of 0.3 mm in depth in the central part by sand blasting method, with the glass substrate 1, low melting solder (Serasolza No. 246, Asahi Glass) was applied by using an ultrasonic soldering apparatus (Sun Bonder USM-IV, Asahi Glass), in the condition of frequency of 50 kHz and heating temperature of 250° C., and the shield material 8 was fixed on the glass substrate 1, and the low melting solder depositing on the white sheet glass was irradiated with laser beam by using a YAG laser irradiation apparatus (ML-2330A, Miyachi Technos) to fuse the low melting solder, and then the glass substrate 1 and shield material 8 were sealed tightly.

In this method, an organic electroluminescence element same as in the first embodiment was fabricated, which was presented as fifth embodiment.

COMPARATIVE EXAMPLE 1

To confirm the effect of the organic electroluminescence elements of the invention presented in EXAMPLES 1, 2, 3, 4, 5, a conventional organic electroluminescence element was fabricated by using an epoxy resin in adhesion between the shield material 8 and glass substrate 1, and growth of dark spots was compared. The epoxy resin used in the conventional organic electroluminescence element was composed of ECR-7125 used as main agent and ECH-7125 as hardener (both made by Sumitomo Bakelite), blended at a rate of 10:6, which was cured for 12 hours at 50° C. The shield material 8 was the same HOYA white sheet glass as used in EXAMPLE 1. The organic electroluminescence element for comparison was same in all of the material, composition and film forming condition, except for the resin used for adhesion. These three elements were stored in an environmental cell at 60° C. and 95%, and growth of dark spots was observed.

Figure 2:
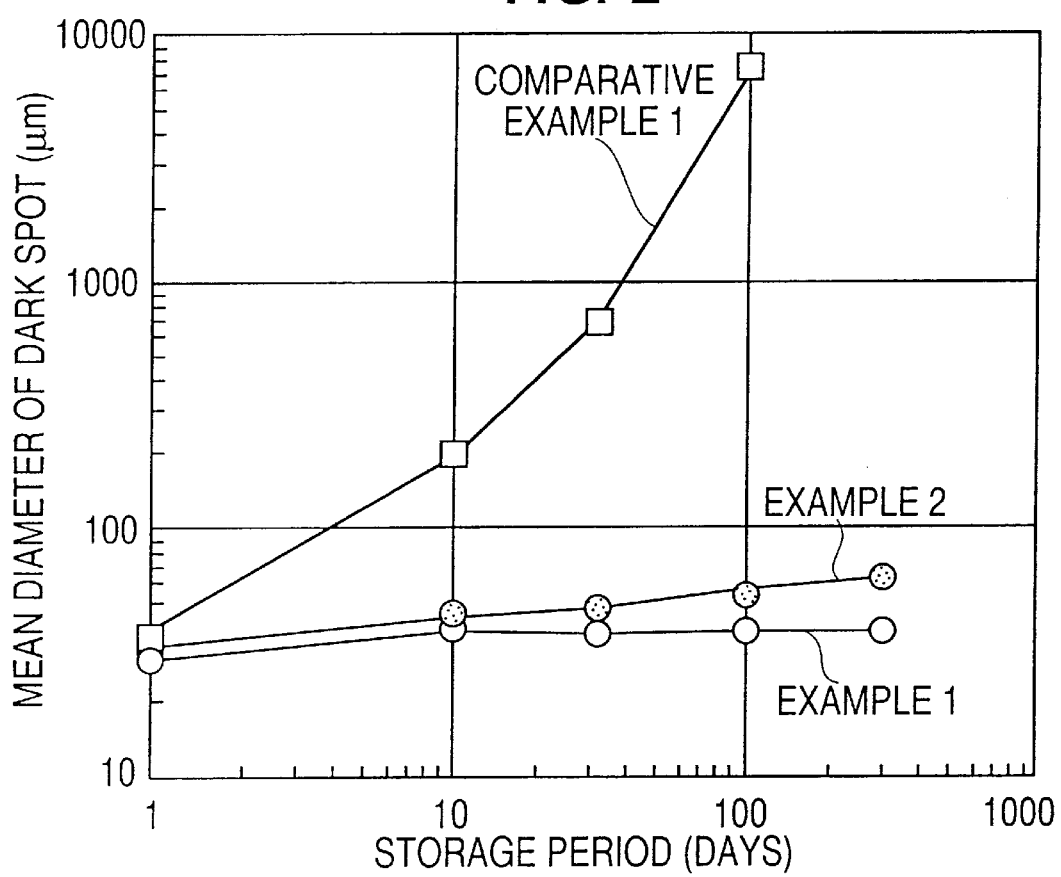
FIG. 2 is a graph showing growth of dark spots in the element sealed by using low melting glass in an embodiment of the invention, and an organic electroluminescence element sealed by using a conventional resin as a comparative example.

To investigate the transitional changes of dark spots in three organic electroluminescence elements of EXAMPLES 1 and 2 and COMPARATIVE EXAMPLE 1, each was stored in a thermostatic cell controlled at 60° C. and 95% of humidity, and the mean diameter of dark spot was microscopically observed at specific time intervals. The result is explained by referring to FIG. 2. As clear from FIG. 2, in both examples of the invention using low melting glass in adhesion of the shield material, growth of dark spots was notably suppressed as compared with the conventional organic electroluminescence element using epoxy resin for adhesion. According to the invention using low melting glass as adhesive, a longer life of organic electroluminescence element may be achieved.

The organic electroluminescence element is not highly resistant to heat, and hence the low melting glass used for adhesion is required to be fused at low temperature. Accordingly, the working temperature for fusing the glass is preferred to be 500° C. or less owing to the characteristic of the organic electroluminescence element, but the material is not particularly limited, and any material may be used as far as the moisture resistance is better than that of organic resin.

To investigate the transitional changes of dark spots in three organic electroluminescence elements of EXAMPLES 4 and 5 and COMPARATIVE EXAMPLE 1, each was stored in a thermostatic cell controlled at 60° C. and 95% of humidity, and the mean diameter of dark spot was microscopically observed at specific time intervals. The result is shown in FIG. 3.

Figure 3:
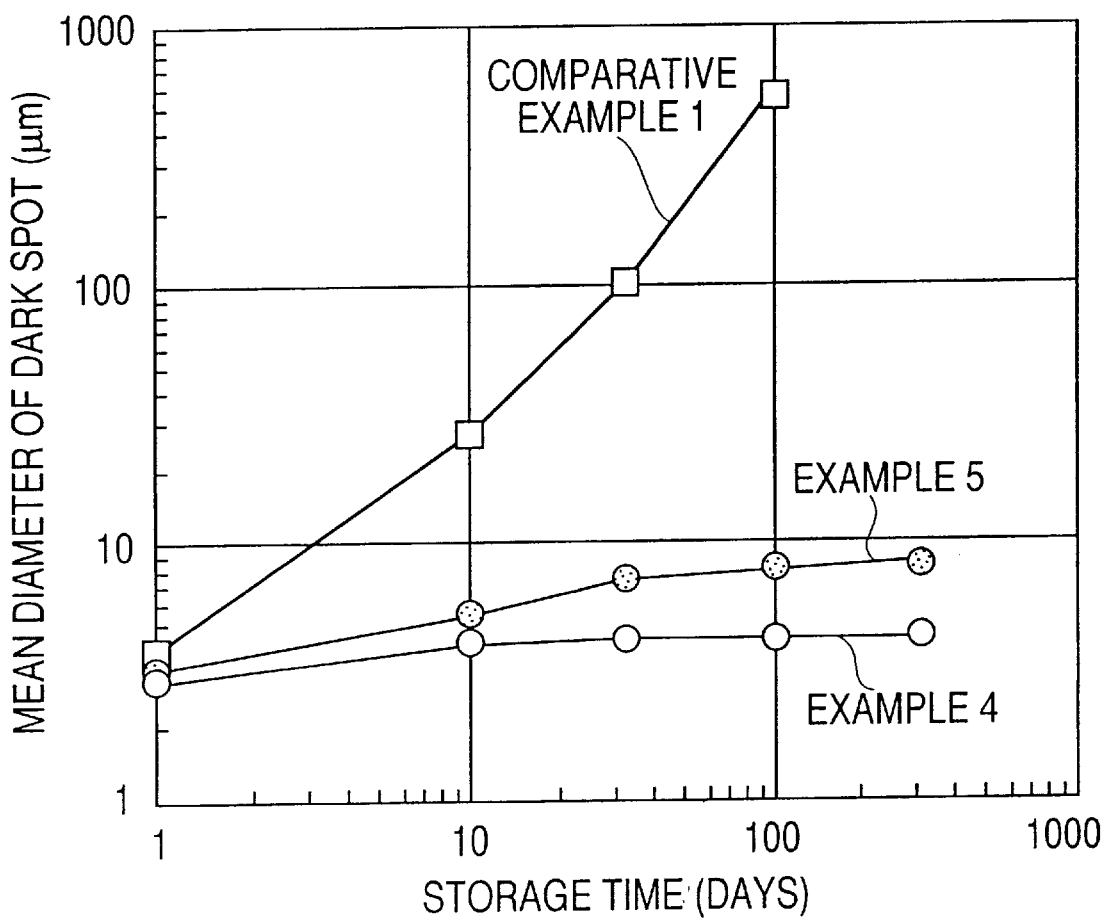
FIG. 3 is a graph showing growth of dark spots in the element sealed by using low melting solder in an embodiment of the invention, and an organic electroluminescence element sealed by using a conventional resin as a comparative example.

FIG. 3 is a relation diagram of storage time and mean diameter of dark spots. As clear from FIG. 3, in the organic electroluminescence element of COMPARATIVE EXAMPLE 1, the mean diameter of dark spots increases along with the passing of the time, whereas in the organic electroluminescence elements of EXAMPLES 4 and 5, notable changes in mean diameter of dark spots were not recognized in spite of very severe environments of 60° C. and humidity of 95% for the organic electroluminescence element, and it was found that growth of dark spots was prevented. In particular, in the organic electroluminescence element of the first embodiment, it was clear that growth of dark spots was prevented nearly perfectly.

EXAMPLE 6

After forming an ITO film of 160 nm in film thickness on a glass substrate 1 by sputtering method, a resist material (OFPR-800 of Tokyo Oka) was applied on the ITO film by spin coating method, and a resist film of 10 microns in thickness was formed, and the resist film was patterned to a specified shape by masking, exposing and developing. This glass substrate 1 was immersed in 50% hydrochloric acid at 60° C., and the ITO film in the portion free from resist film was etched, and then the resist film was also removed, thereby obtaining a glass substrate 1 forming an anode 2 made of an ITO film of specified pattern.

This glass substrate 1 was cleaned ultrasonically for 5 minutes in a detergent (Semico Clean, Furuuchi Chemical), cleaned ultrasonically for 10 minutes in purified water, cleaned ultrasonically for 5 minutes in a solution of 1 part (by volume) of ammonia water, 1 part of hydrogen peroxide water, and 5 parts of water, and cleaned ultrasonically for 5 minutes in purified water at 70° C., sequentially, and moisture deposits on the glass substrate 1 were removed by nitrogen blower, and it was heated and dried at 250° C.

On the anode 2 side surface of the dried glass substrate 1, TPD was formed in a film thickness of about 50 nm as hole transfer layer 4 in a resistance heating deposition apparatus evacuated to a degree of vacuum of $2 \times 10^{-6}$ Torr or less.

Next, similarly in the resistance heating deposition apparatus, Alq3 was formed in a film thickness of about 75 nm as luminous layer 5 on the hole transfer layer 4. The deposition speed of both TPD and Alq3 was 0.2 nm/s.

Also in the resistance heating deposition apparatus, a cathode 6 was formed in a film thickness of 200 nm on the luminous layer 5, using an Al—Li alloy containing 10 wt % of Li as deposition source.

In this manner, plural glass substrates 1 laminating the anode 2, hole transfer layer 4, luminous layer 5 and cathode 6 were fabricated, and protective films composed of GeO film were formed in various thicknesses by ion beam sputtering method so that the organic thin film layer 3 composed of hole transfer layer 4 and luminous layer 5 and the cathode 6 might be at least sealed, thereby obtaining organic electroluminescence elements.

Using these organic electroluminescence elements, characteristics were evaluated by the parameter of film thickness of protective film.

To study transitional changes of dark spots in these organic electroluminescence elements, each was stored in a thermostatic cell controlled at 40° C. and humidity of 90% for 500 hours, and the number of dark spots per unit area grown before and after storage test was determined by microscopic observation. The result is explained by referring to FIG. 7.

Figure 7:
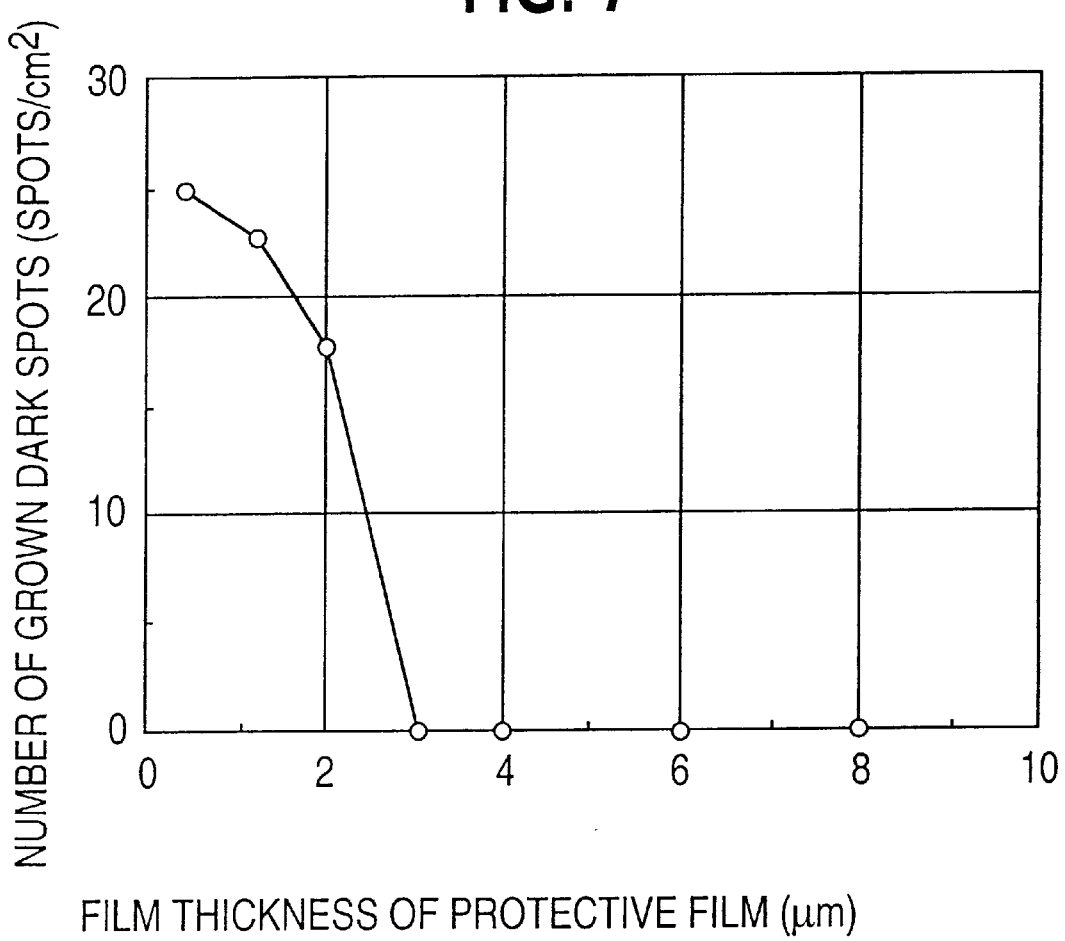
FIG. 7 is a graph showing film thickness and number of dark spots of a protective film of an organic electroluminescence element in an embodiment of the invention.

FIG. 7 is a relation diagram of the film thickness of protective film and number of grown dark spots. As shown in FIG. 7, as the film thickness of the protective film increases, the number of grown dark spots decreases, and at film thickness of 3 microns or more, almost no grown dark spot was recognized.

As already explained, a main cause of dark spot is regarded as dust particles of several microns existing on the substrate 1. Therefore, the embodiment verifies that growth of dark spots can be prevented perfectly by forming a protective film in a sufficient film thickness for completely covering such dust particles, and the required film thickness is known to be 3 microns or more.

On the other hand, as for the film thickness of protective film, if too thick, cracks may be formed due to internal stress or peeling tendency may be noted, and hence the film thickness of the protective film must be in a range of 3 microns to 30 microns.

Since the results of the embodiment suggest that growth of dark spots can be suppressed completely by the protective film alone without sealing with glass cap or the like, and it brings about an excellent effect also from the viewpoint that a flexible organic electroluminescence element can be fabricated.

To form the oxide such as GeO film as the protective film, it is preferred to employ the ion beam sputtering method as in this embodiment, but the film forming method is not limited to this lone, but it may be also formed by other method such as resistance heating deposition method.

Similarly, the film forming method of the cathode 6 is not particularly limited, and aside from the resistance heating deposition method disclosed in the embodiment, ion beam sputtering method, magnetron sputtering method, electron beam resistance heating deposition method and others may be employed, but anyway it is required to form the film so that the temperature may not exceed the heat resistance of the organic material while forming the film.

EXAMPLES 7, 8

Same as in the preceding example, two organic electroluminescence elements were fabricated by laminating an anode 2 made of ITO film, a hole transfer layer 4 made of TPD, a luminous layer 5 made of Alq3, and a cathode 6 made of Al—Li alloy on a glass substrate 1.

In one of them, a protective film made of GeO film was formed on the glass substrate 1 in a film thickness of 3 microns by ion beam sputtering method so as to seal at least the organic thin film layer 3 composed of hole transfer layer 4 and luminous layer 5 and cathode 6, which was presented as EXAMPLE 7. Its sectional view is shown in FIG. 5.

In the other, after forming a GeO film on the glass substrate 1 in a film thickness of 1 micron by resistance heating deposition method so as to seal at least the organic thin film layer 3 composed of hole transfer layer 4 and luminous layer 5 and the cathode 6, an Ag film was formed in a film thickness of 2 microns on this GeO by resistance heating deposition method, which was presented as EXAMPLE 8.

In EXAMPLE 8, meanwhile, although the GeO film was formed by resistance heating deposition method, this is because the GeO and Ag can be formed continuously in the same deposition apparatus, and also because invasion or deposit of dust in the protective film during the film forming process can be prevented. As for the forming method of GeO film, generally, the internal stress in the film can be reduced in the ion beam sputtering method as compared with the resistance heating deposition method.

In the two organic electroluminescence elements obtained in these methods, a constant current of 15 $mA/cm^2$ was applied between the anode 2 and cathode 6, and a continuous light emission test was conducted, and changes in luminance of light emission in the light emission duration were studied. The result is explained by referring to FIG. 8.

Figure 8:
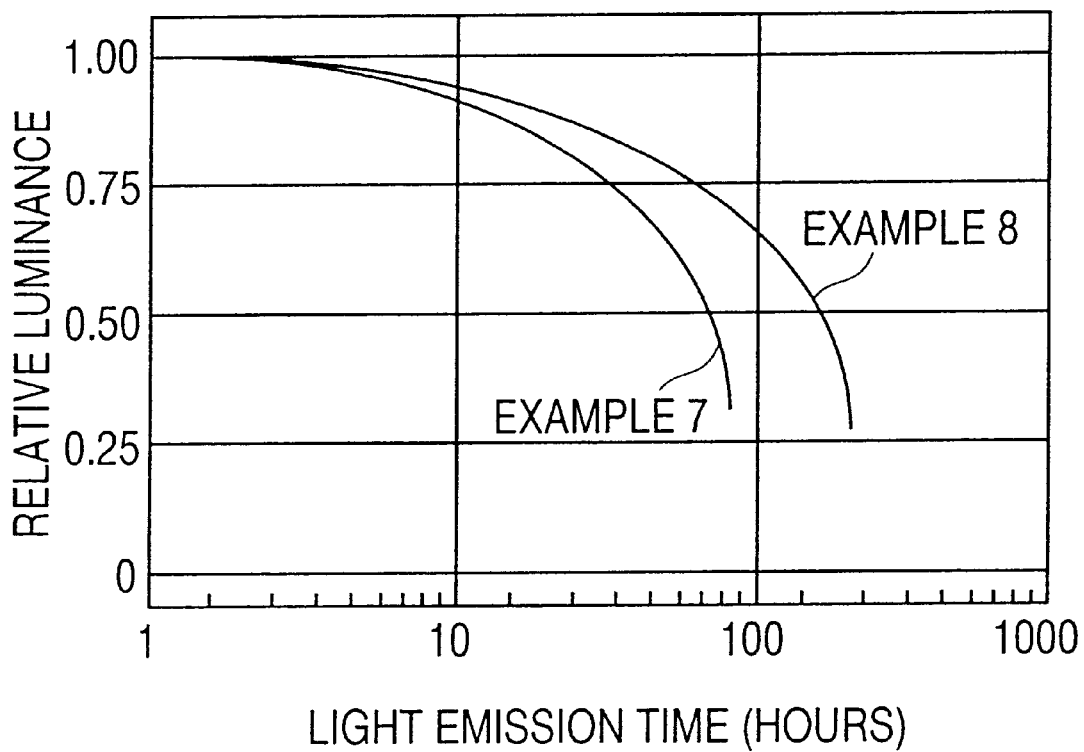
FIG. 8 is a graph showing light emitting time and relative luminance of the organic electroluminescence element in an embodiment of the invention.

FIG. 8 is a relation diagram of light emission duration and relative luminance in the continuous light emission test. In FIG. 8, the relative luminance refers to the luminance of light emission expressed as a relative value at each light emission time in terms of light emitting luminance of 1 upon start of continuous light emission test. As shown in FIG. 8, although EXAMPLE 7 forming the protective film in a single layer of GeO film was 3 microns in the protective film, it was clear that transitional lowering of luminance of light emission is smaller in EXAMPLE 8 having the protective layer composed in two-layer structure of GeO film and Ag film.

The reason of such difference in characteristic is not clear, but relation of thermal conductivity of GeO film and Ag film is estimated as one factor. That is, the film composed of oxide or nitride is generally large in the internal stress as compared with metal film, and hence inferior in thermal conductivity. Therefore, as compared with EXAMPLE 7, EXAMPLE 8 is superior in thermal conductivity of protective film, and the heat generated by light emission is considered to be released smoothly outside through the protective film. In the organic electroluminescence element, if release of heat caused by light emission is poor, the organic thin film layer 3 is likely to deteriorate. Considering from such relation, it is estimated that transitional decline of luminance of light emission is smaller in EXAMPLE 8.

As known from these results, as the protective layer 7, the luminous characteristic is excellent in the laminate structure of insulating compound layer 7a made of oxide or nitride and metal film 7b, rather than a single layer of oxide or nitride. Furthermore, since the metal is superior in film forming property to the oxide or nitride, by defining the total film thickness of the protective film 7 in a range of 3 microns to 30 microns, in the structure comprising the insulating compound layer 7a formed in the lowest layer and the metal film 7b formed on the insulating compound layer 7a, growth of dark spots can be completely suppressed, and the organic electroluminescence element small in lowering of luminance of light emission can be realized.

EXAMPLE 9

Same as in the preceding example, an organic electroluminescence element was fabricated by laminating an anode 2 made of ITO film, a hole transfer layer 4 made of TPD, a luminous layer 5 made of Alq3, and a cathode 6 made of Al—Li alloy on a glass substrate 1.

On this glass substrate 1, a GeO film was formed in a film thickness of 1 micron as protective film on the cathode 6 in a resistance heating deposition apparatus so as to seal at least the organic thin film layer 3 composed of hole transfer layer 4 and luminous layer 5 and the cathode 6, and an Ag film was continuously formed in a film thickness of 14 microns.

On the glass substrate 1 thus forming the protective film on, a glass cap of 1 mm thick white sheet glass forming a recess of 0.3 mm in depth in the central part by sand blasting method was applied by curing be emitting 1 joule of ultraviolet ray, using UV resin (Wardlock No. 856, Kyoritsu Chemical Industries) as sealant, and an organic electroluminescence element as shown in FIG. 6 was obtained.

This organic electroluminescence element was kept in a thermostatic cell controlled at 85° C. and humidity of 85%, and changes of shape of dark spot along with passing of the time were observed. To observe the transitional changes of shapes of dark spots, by emitting light in the same manner as in EXAMPLES 7 and 8, the diameter of each dark spot was measured by microscopic observation, and the mean was calculated. The result is explained by referring to FIG. 9.

Figure 9:
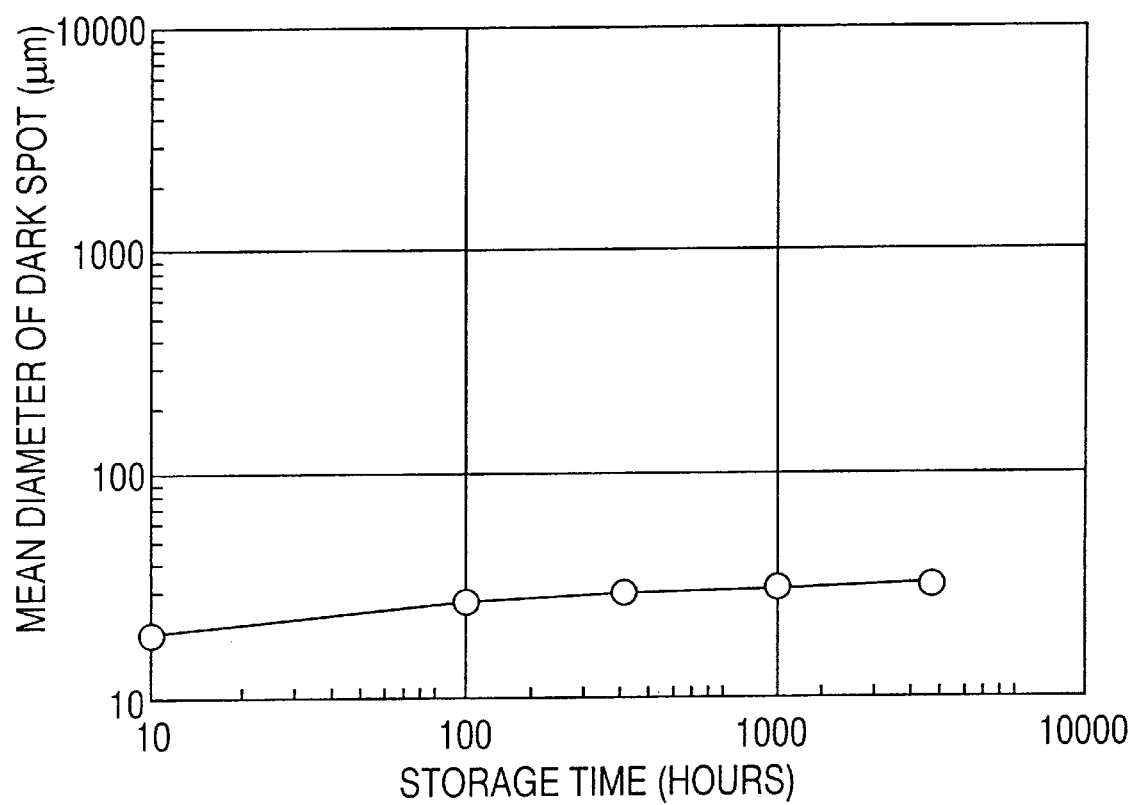
FIG. 9 is a graph showing growth of dark spots in an organic electroluminescence element in an embodiment of the invention.

FIG. 9 is a relation diagram of storage time and mean diameter of dark spots in the storage test of the organic electroluminescence element of EXAMPLE 9. As shown in the diagram, in the extremely severe environments of 85° C. and humidity of 85% for the organic electroluminescence element, more difficult than in the evaluation condition in EXAMPLES 7 and 8, it was cleared that growth of dark spots was hardly noted.

thus, according to the organic electroluminescence element of the embodiment, it was proved that growth of dark spots can be completely prevented practically for an extremely long period.

EXAMPLE 10

Same as in the preceding example, an organic electroluminescence element was fabricated by laminating an anode 2 made of ITO film, a hole transfer layer 4 made of TPD, a luminous layer 5 made of Alq3, and a cathode 6 made of Al—Li alloy on a glass substrate 1.

Moreover, same as in EXAMPLE 6, in a resistance heating deposition apparatus, a GeO film of film thickness of 0.5 micron and an Ag film of film thickness of 0.5 micron were formed at a deposition speed of 0.2 nm/s so as to seal at least the organic thin film 3 composed of hole transfer layer 4 and luminous layer 5 and the cathode 6. Thus fabricated organic electroluminescence element was presented as EXAMPLE 10.

COMPARATIVE EXAMPLE 2

By way of comparison, an organic electroluminescence element was fabricated in the same manner as in EXAMPLE 10 except that the protective film was formed of a single layer of GeO of 1 micron in film thickness, and COMPARATIVE EXAMPLE 2 was obtained.

The organic electroluminescence elements of EXAMPLE 10 and COMPARATIVE EXAMPLE 2 were kept in a thermostatic cell controlled at 40° C. and humidity of 90%, and changes of shape of dark spots with passing of the time were observed. To observe the transitional changes of shape of dark spots, same as in EXAMPLE 4, the mean diameter of dark spots after letting stand for a specific time was determined. The result is explained by referring to FIG. 10.

Figure 10:
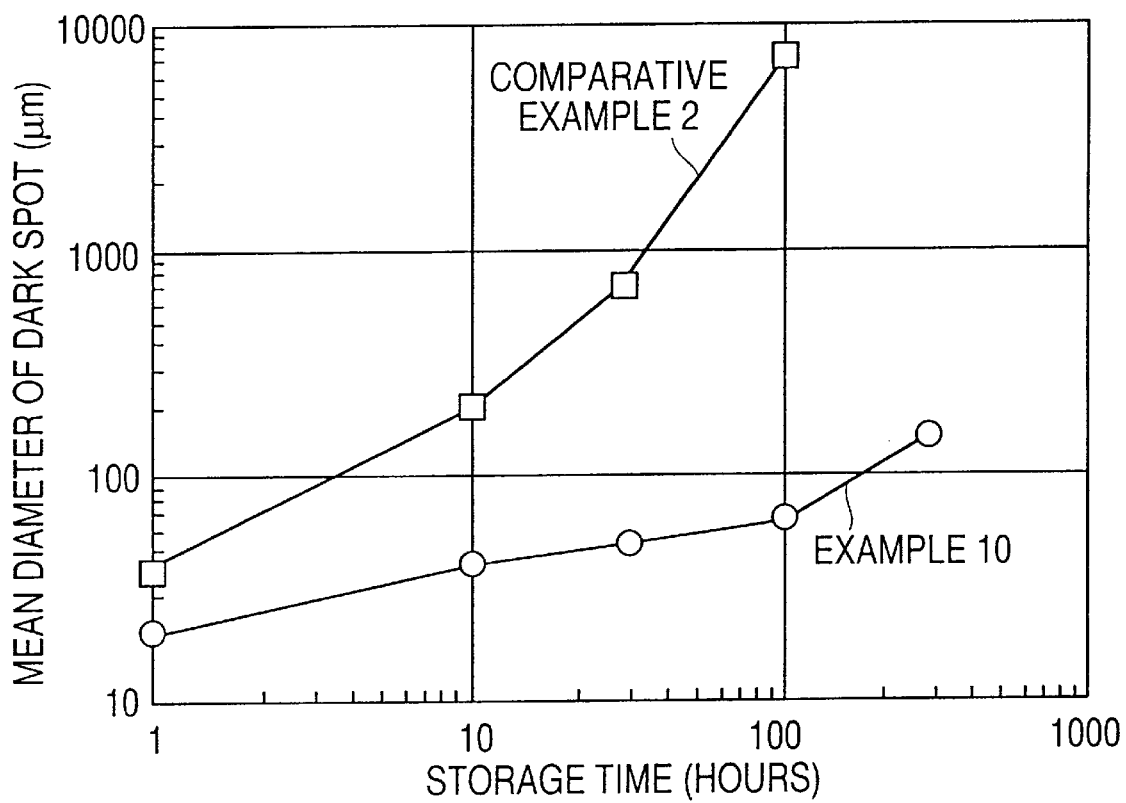
FIG. 10 is a graph showing growth of dark spots in an organic electroluminescence element in an embodiment of the invention.

FIG. 10 is a relation diagram of storage time and mean diameter of dark spots in the storage test of the organic electroluminescence elements of EXAMPLE 10 and COMPARATIVE EXAMPLE 2. As shown in FIG. 10, in the organic electroluminescence element of EXAMPLE 10, as compared with COMPARATIVE EXAMPLE 1, it was clear that the growth of dark spots was suppressed from the beginning of storage test. In particular, comparing the results in the first 100 hours, the growth of dark spots was found to be suppressed very effectively as compared with COMPARATIVE EXAMPLE 2.

Thus, as compared with the conventional one using a protective layer composed of oxide only, it was proved that growth of dark spots could be suppressed in the embodiment by using the protective film of laminate structure composed of an insulating compound layer 7 such as oxide formed in the lowest layer and a metal layer formed on the insulating compound layer 7.

EXAMPLE 11

Forming organic electroluminescence elements same as in EXAMPLE 10 and COMPARATIVE EXAMPLE 2, a glass cap made of white sheet glass of plate thickness of 1 mm forming a recess of 0.3 mm in depth in the central part by sand blasting method was applied on each glass substrate 1 by letting stand for 12 hours at 50° C. and curing, using epoxy resin (ECR-7125, ECH-7125, Sumitomo Bakelite, mixing ratio 10:6) as sealant, and two organic electroluminescence elements having glass cap were fabricated as shown in FIG. 6.

COMPARATIVE EXAMPLE 3

One of them having a glass cap applied on the organic electroluminescence element of EXAMPLE 10 was presented as Example 11, and the other having a glass cap applied on the organic electroluminescence element of COMPARATIVE EXAMPLE 2 was presented as COMPARATIVE EXAMPLE 3.

The organic electroluminescence elements of EXAMPLE 11 and COMPARATIVE EXAMPLE 3 were kept in a thermostatic cell controlled at 40° C. and humidity of 90%, and changes of shape of dark spots with passing of the time were observed. To observe the transitional changes of shape of dark spots, same as in EXAMPLE 41, the mean diameter of dark spots, after letting stand for a specific time was determined. The result is explained by referring to FIG. 11.

Figure 11:
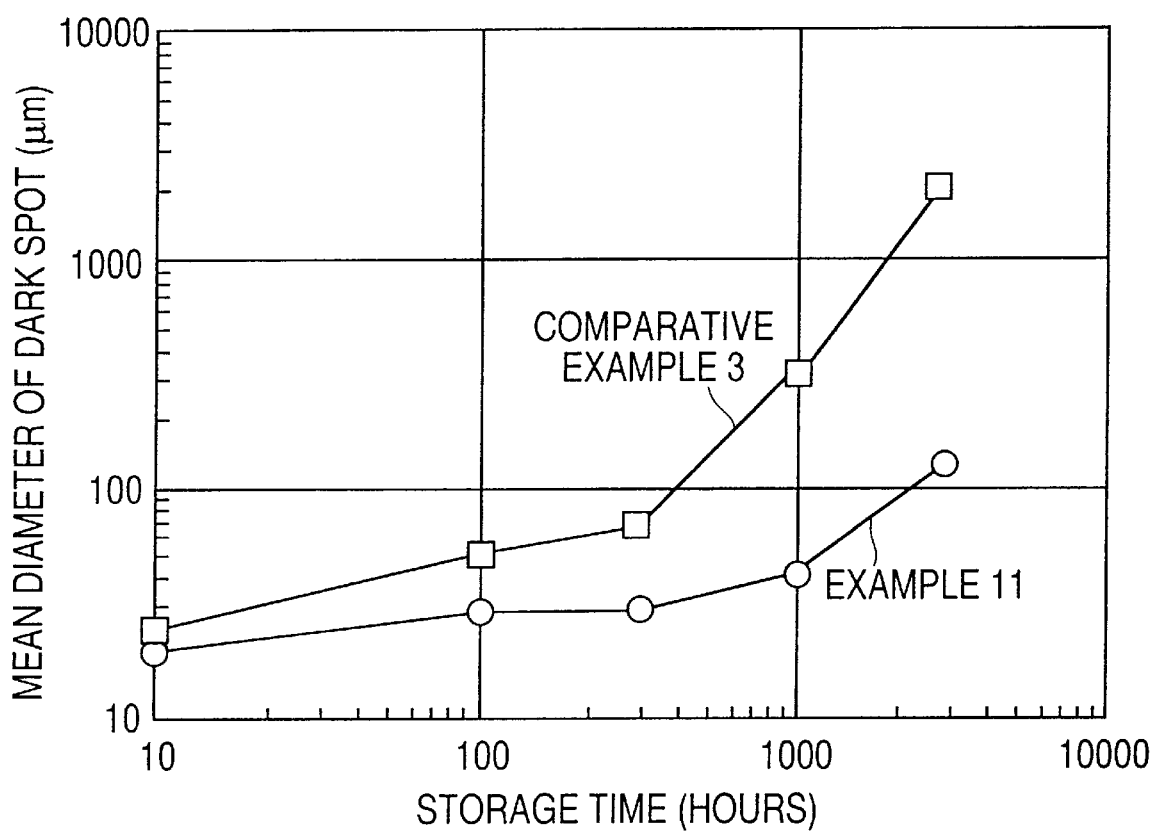
FIG. 11 is a graph showing growth of dark spots in an organic electroluminescence element in an embodiment of the invention.

FIG. 11 is a relation diagram of storage time and mean diameter of dark spots in the storage test of the organic electroluminescence elements of EXAMPLE 11 and COMPARATIVE EXAMPLE 3. As shown in FIG. 11, in the organic electroluminescence element of EXAMPLE 11, as compared with COMPARATIVE EXAMPLE 3, it was clear that the transitional growth of dark spots was suppressed in the storage test for a long period. In particular, in EXAMPLE 11, comparing the results in the first 100 hours, the growth of dark spots was found to be suppressed very effectively as compared with COMPARATIVE EXAMPLE 3.

EXAMPLE 12

Figure 12:
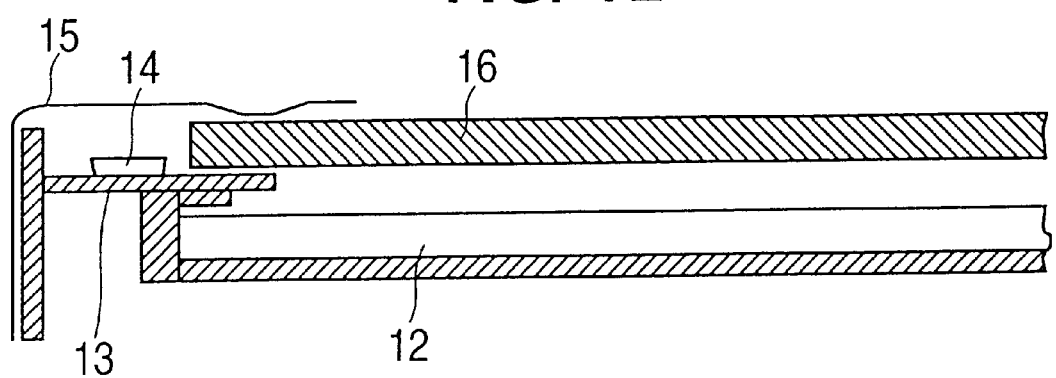
FIG. 12 is a sectional view of using an organic electroluminescence element in an embodiment of the invention in a display panel for backlight.

Same as in the preceding example, an organic electroluminescence element was fabricated by laminating an anode 2 made of ITO film, a hole transfer layer 4 made of TPD, a luminous layer 5 made of Alq3, and a cathode 6 made of Al—Li alloy on a glass substrate 1, and it was used in the backlight for liquid crystal display. The structure is shown in FIG. 12. The element of organic electroluminescence was composed in a multi-layer structure as shown below in order to obtain white light emission. First, in the fabricating method, on a glass substrate 1 with ITO in a series of 52 mm×15 mm×1 mm, TPD as hole transfer layer was laminated in 500 angstroms, oxazole complex of zinc as blue luminous layer 5 in 300 angstroms, Alq3 as green luminous layer 5 in 200 angstroms, and Alq3 doped with 1.5 mol. % of phenoxazone as red luminous layer 5 in 200 angstroms, sequentially by vacuum resistance heating deposition method. In succession, an AlLi alloy of Li concentration of 10 at % as cathode was formed in 2000 angstroms, and in the same chamber without breaking vacuum, geranium oxide (GeO) was formed in 5000 angstroms, and it was taken out of the chamber. To seal this element, a 1 mm thick white sheet glass substrate 1 was used as shield material 8, and it was sealed by using low melting glass used in EXAMPLE 1. Thus obtained organic electroluminescence element sealed with the shield material 8 was disposed at the back side of the liquid crystal display unit, and a liquid crystal module was completed. In FIG. 12, the liquid crystal module is composed of a chassis 13, a driver 14 for controlling a liquid crystal display panel 16, and a metal frame 15 on the outer circumference.

In the conventional apparatus using a cold cathode-ray tube in the backlight, a diffusion plate must be disposed at the back side of the liquid crystal display device in order to make uniform the luminous plane. By contrast, in the liquid crystal module of the invention using the organic electroluminescence element, since diffusion plate is not required, a thin structure is realized.

In the embodiment, in order to obtain white light emission, the blue luminous layer, green luminous layer, and red luminous layer were laminated, but it is also no problem in the single-layer structure of mixing blue, green and red pigments in the luminous layer 5. The luminous materials used for each color are not particularly limited, but oxadiazole derivative, tetraphenyl cyclopentadiene or the like may be used as blue luminous material, or DCM doped Alq3 or the like may be used as red luminous material. In particular, when used in the display unit of portable backlight such as watch, calculator and telephone, white light is not always needed, and monochromic light of blue, green or red may be used. Hence, the luminous layer 5 may be formed only of a material emitting each light.

EXAMPLE 13

Figure 13:
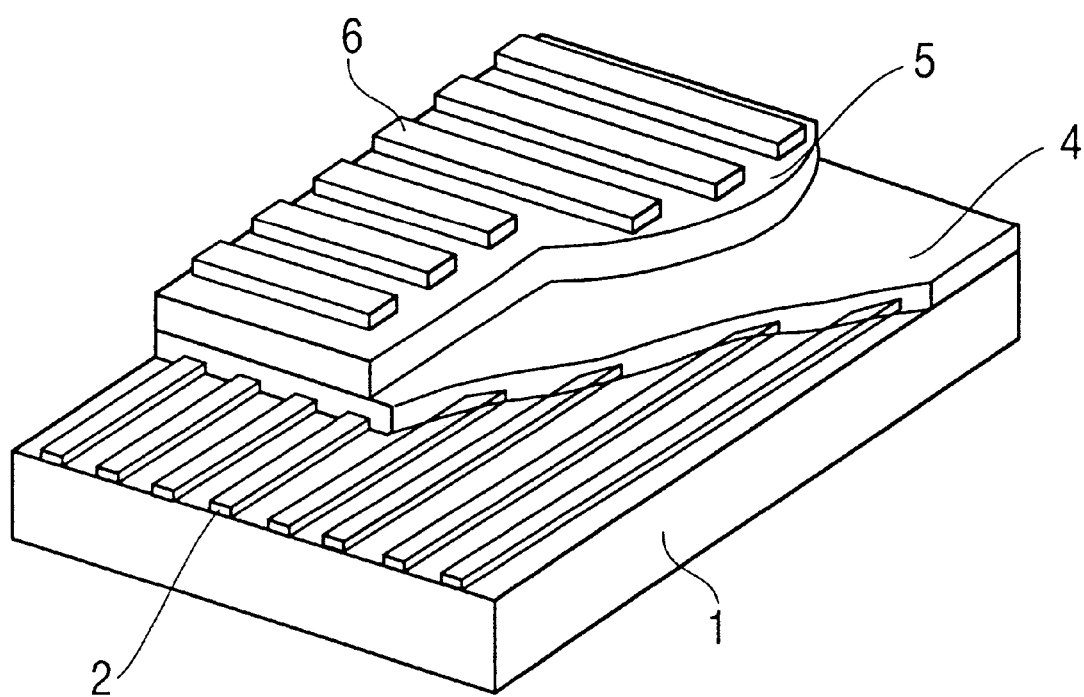
FIG. 13 is a perspective view of an organic electroluminescence element in an embodiment of the invention used in a display panel of dot matrix type.
Figure 14:
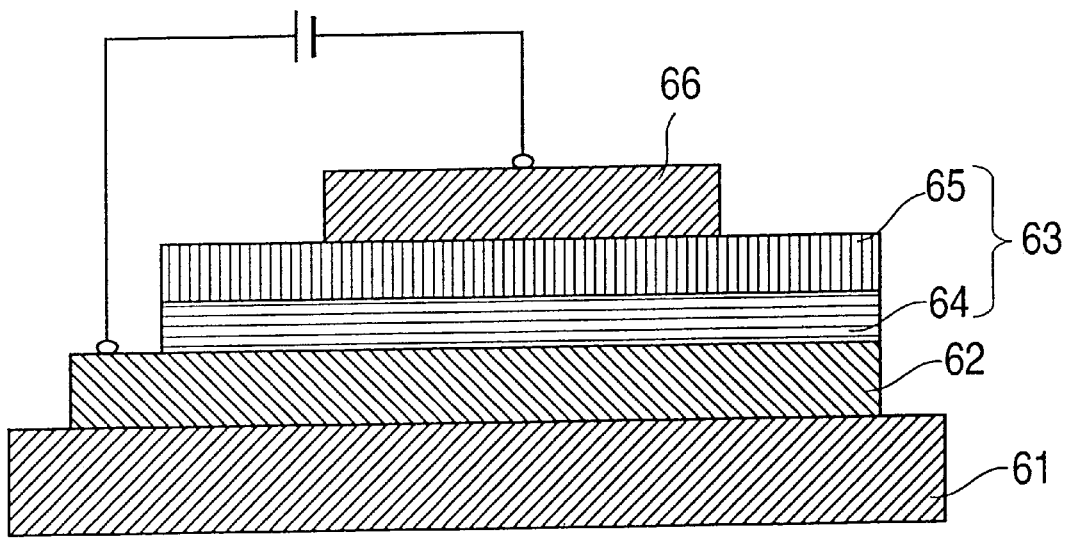
FIG. 14 is an essential sectional view of an organic electroluminescence element in a prior art.

FIG. 13 shows the structure of a dot matrix type display panel.

First, after forming an ITO film in a film thickness of 160 nm on a glass substrate 1 by sputtering method, a resist material (OFPR-800; Tokyo Oka) was applied on the ITO film by spin coating method, a 10-micron thick resist film was formed, and the resist film was patterned in a linear form of width of 300 microns and pitch of 400 microns by masking, exposing and developing.

This glass substrate 1 was then immersed in 50% hydrochloric acid at 60° C., and the ITO film in the portion free from forming of resist film was etched, and the resist film was also removed to be used as anode, and the glass substrate 1 forming the ITO electrode 2 patterned in a linear form in width of 300 microns and pitch of 400 microns was obtained.

This glass substrate 1 was cleaned ultrasonically for 5 minutes in a detergent (Semico Clean, Furuuchi Chemical), cleaned ultrasonically for 10 minutes in purified water, cleaned ultrasonically for 5 minutes in a solution of 1 part of ammonia water, 1 part of hydrogen peroxide water, and 5 parts of water, and cleaned ultrasonically for 5 minutes in purified water at 70° C., and water deposits on the glass substrate 1 were removed by nitrogen blower, then it was heated and dried at a temperature of 250° C.

On the ITO electrode 2 side surface of the dried glass substrate 1, a TPD film was formed in a film thickness of about 50 nm as hole transfer layer 4 in a resistance heating deposition apparatus evacuated to a degree of vacuum of $2 \times 10^{-6}$ Torr or less.

Next, similarly in the resistance heating deposition apparatus, an Alq3 film was formed in a film thickness of about 75 nm as luminous layer 5 on the TPD film. The deposition speed of both TPD film and Alq3 film was 0.2 nm/s.

Also in the resistance heating deposition apparatus, on the Alq3 film, using Al—Li alloy containing 10 at % of Li as deposition source, a metal mask was disposed between the substrate 1 and deposition source, and an Al—Li alloy electrode as cathode 6 was formed in a width of 300 microns, pitch of 400 microns, and film thickness of 200 nm so as to be orthogonal to the ITO pattern. Further on the Al—Li alloy electrode, a GeO film in a film thickness of 1 micron and an Ag film in a film thickness of 10 microns were sequentially laminated by ion beam sputtering method, and a protective film 7 was formed.

On the glass substrate 1 thus forming the protective film on, a glass cap of 1 mm thick white sheet glass forming a recess of 0.3 mm in depth in the central part by sand blasting method was applied by curing by emitting 1 joule of ultraviolet ray, using UV resin (Wardlock No. 856, Kyoritsu Chemical Industries) as sealant, and a display panel was fabricated.

Figure 17:
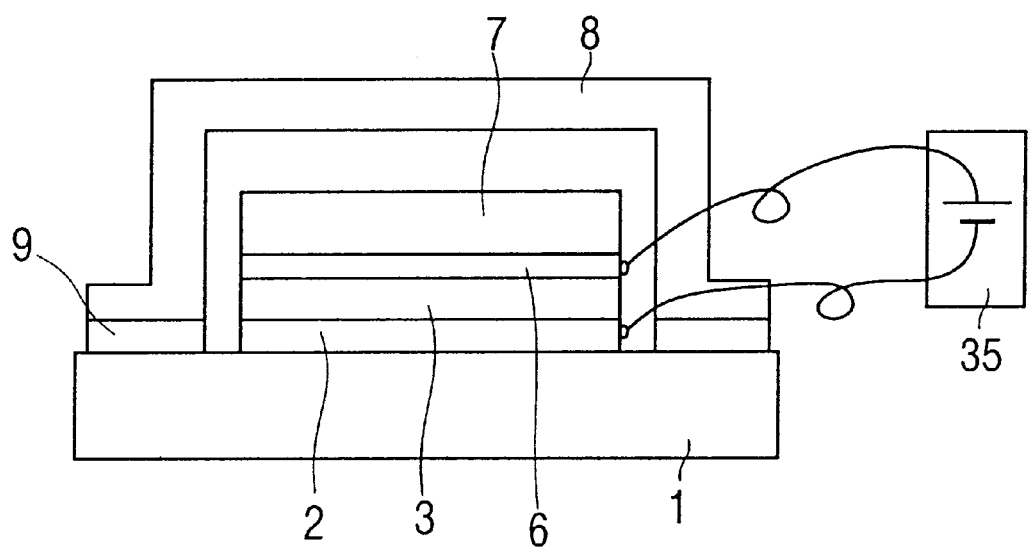
FIG. 17 is an essential sectional view of a display device in an embodiment of the invention.

A display device included this electroluminescence element and a driver is shown at FIG. 17. In thus obtained display panel of FIG. 17, by connecting a driver 35 with the ITO film as the positive side and the Al—Li alloy electrode at the negative side, and applying a direct-current voltage or direct-current current in the selected anode 2 and cathode 6, the orthogonal pattern emits light, so that it may be used as display device of dot matrix type.

Thus, according to the invention, by adhering glass or stainless steel to the substrate 1 with low melting glass or low melting solder, invasion of moisture or oxygen into the cathode 6 or organic thin film layer 3 can be completely shut off, growth of dark spots in the luminous layer 5 can be prevented, and transitional decline of luminance of light emission can be suppressed, so that it obtains excellent effects of notably enhancing the durability and reliability of the organic electroluminescence element.

Besides, by using the insulating compound layer 7a and metal layer 7b in the protective layer 7, it is easy to form the protective layer 7, and the film forming property is improved, and as compared with the single layer of insulating compound layer 7a, transitional decline of luminance of light emission can be effectively suppressed, and hence the durability and reliability are superior, and it obtains an excellent effect of realizing to present an organic electroluminescence element of high mass producibility.

Moreover, by adhering glass or stainless steel to the substrate 1 by low melting glass or low melting solder, damage of protective film 7, cathode 6, organic thin film layer 3, and anode 2 by external factors can be prevented, and it also gives an excellent effect of presenting an organic electroluminescence element excellent in working efficiency in handling, storing, and conveying.

According to the manufacturing method of organic electroluminescence element of the invention, the shield material 8 capable of completely shutting off invasion of moisture or oxygen into the cathode 6 and organic thin film layer 3 can be formed easily and mass producibility, and the substrate 1 and shield material 8 can be adhered in an extremely short time and at a low heating temperature by using ultrasonic wave or laser beam, which gives an excellent effect of manufacturing the organic electroluminescence element excellent in durability and reliability mass producibility and at low cost.

According to the display device of the invention, it gives an excellent effect of presenting a display device small in transitional decline of luminance of light emission, and excellent in durability and reliability.

What is claimed is:

1. An organic electroluminescence element comprising:

a substrate, a laminate structure disposed on the upper side of said substrate, including an anode, an organic thin film layer having a light emitting function, and a cathode, a protective layer disposed on the surface of said laminate structure, and a shield member disposed on the surface of said substrate to cover the outer surface side of said protective layer and said laminate structure, wherein said protective layer is in a thickness range of about 3 microns to about 30 microns.

2. An organic electroluminescence element comprising:

a substrate, a laminate structure disposed on the upper side of said substrate, including an anode, an organic thin film layer having a light emitting function, and a cathode, a protective layer disposed on the surface of said laminate structure, and a shield member disposed on the surface of said substrate to cover the outer surface of said protective layer and said laminate structure such that said shield member covers at least an outer side surface of said anode.

3. An organic electroluminescence element of claim 2, wherein said shield member is one of electric insulating glass and stainless steel.

4. The organic electroluminescence element of claim 2, wherein said shield member includes an adhesive layer that engages said substrate.

5. The organic electroluminescence element of claim 2, wherein said protective layer possesses plural layers, and the lowest layer of said plural layers is an electric insulating compound layer.

6. An organic electroluminescence element comprising:

a substrate, a laminate structure disposed on the upper side of said substrate, including an anode, an organic thin film layer having a light emitting function, and a cathode, a protective layer disposed on the surface of said laminate structure, and a shield member disposed on the surface of said substrate to cover the outer surface side of said protective layer and said laminate structure, wherein said protective layer includes:

an electric insulating layer disposed at a lowest layer, and a metal layer disposed on said electric insulating compound layer.

7. An organic electroluminescence element comprising:

a substrate, a laminate structure disposed on the upper side of said substrate, including at least one anode, an organic thin film layer having a light emitting function, and at least one cathode, a protective layer disposed on the outer surface of said laminate structure such that said protective layer covers at least an outer side surface of said at least one anode.

8. An organic electroluminescene element of claim 7, further comprises:

a shield member disposed on the surface of said substrate, covering the outer surface side of said laminate structure and said protective layer.

9. The organic electroluminescence element of claim 7, wherein said protective layer engages said outer side surface of said at least one anode for providing a tight seal.

10. The organic electroluminescence element of claim 7, wherein said protective layer possesses plural layers, and the lowest layer of said plural layers is an electric insulating compound layer.

11. A liquid crystal display device comprising:

an organic electroluminescence element of claim 7, and a liquid crystal display panel disposed at the front surface side of said organic electroluminescence element, wherein said organic electroluminescence element has a function as an illuminating device.

12. A display device comprising:

an organic electroluminescence element of claim 7, and a driver connected to said at least one anode and said at least one cathode, wherein said at least one anode includes first plural electrodes, said at least one cathode includes second plural electrodes, and when a voltage or current is applied to one of said first plural electrodes and one of said second plural electrodes, said organic thin film layer at the intersecting position of the applied electrodes emits light.

13. An organic electroluminescence element comprising:

a substrate, a laminate structure disposed on the upper side of said substrate, including an anode, an organic thin film layer having a light emitting function, and a cathode, and a protective layer disposed on the surface of said substrate, so as to cover the outer surface side of said laminate structure, wherein said protective layer is formed of a substance for suppressing penetration of moisture and oxygen, and said protective layer suppresses penetration of said moisture and said oxygen into said laminate structure, wherein said protective layer having electric insulating property is in a thickness range of about 3 microns to about 30 microns.

14. An organic electroluminescence element comprising:

a substrate, a laminate structure disposed on the upper side of said substrate, including at least one anode, an organic thin film layer having a light emitting function, and at least one cathode, and a protective layer disposed on the surface of said substrate, so as to cover an outer side surface of said laminate structure wherein said protective layer covers at least an outer side surface of said at least one anode, wherein said protective layer is formed of a substrate for suppressing penetration of moisture and oxygen, and said protective layer suppresses penetration of said moisture and said oxygen into said laminate structure.

15. An organic electroluminescence element of claim 14, wherein said protective layer is at least one selected from the group consisting of GeO, SiO, $SiO_2$, $MoO_3$, AlN, $Si_3N_4$, and organic macromolecular polymer.

16. The organic electroluminescence element of claim 14, wherein said protective layer engages said outer side surface of said laminate structure for providing a tight seal.

17. The organic electroluminescence element of claim 16, wherein said outer side surface of said laminate structure includes said organic film thin layer and cathode.

18. The organic electroluminescence element of claim 14, wherein said protective layer possesses plural layers, and the lowest layer of said plural layers is an electric insulating compound layer.

19. An organic electroluminescence element of claim 14,
wherein said at least one anode includes first plural electrodes in X-direction, said at least one cathode includes second plural electrodes in Y-direction orthogonal to said X-direction, and
when a voltage or current is applied to one of said first plural electrodes and one of said second plural electrodes, said organic thin film layer at the intersecting position of the applied electrodes emits light.

20. An organic electroluminescence element of claim 14,
wherein a liquid crystal panel is disposed at the front surface of said substrate, and
when a current or voltage is applied to said at least one anode and said at least one cathode, the portion of said organic thin film layer enclosed by said at least one anode and said at least one cathode emits light so as to function as an illuminating device.

21. An organic electroluminescence element of claim 14,
wherein said organic thin film layer is one selected from the group consisting of (1) luminous layer only, (2) luminous layer and hole transfer layer, and (3) hole transfer layer, luminous layer, and electron transfer layer.

22. An organic electroluminescence element of claim 14, further comprising:
a shield member disposed on the surface of a surrounding region of said laminate structure of said substrate, covering said protective layer.

23. An organic electroluminescence element comprising:
a substrate,
a laminate structure disposed on the upper side of said substrate, including an anode, an organic thin film layer having a light emitting function, and a cathode, and
a protective layer disposed on the surface of said substrate, so as to cover the outer surface side of said laminate structure,
wherein said protective layer is formed of a substrate for suppressing penetration of moisture and oxygen, and said protective layer suppresses penetration of said moisture and said oxygen into said laminate structure, wherein said protective layer possesses plural layers, and the lowest layer of said plural layers is an electric insulating compound layer, wherein a metal layer is disposed on said electric insulating compound layer.

24. An organic electroluminescence element of claim 23,
wherein said metal layer is at least one selected from the group consisting of Ag, In, Cu, Al, Cr, Fe, Ni—Fe, and Fe—Cr.

25. An organic electroluminescence element comprising:
a substrate,
a laminate structure disposed on the upper side of said substrate, including an anode, an organic thin film layer having a light emitting function, and a cathode,
a protective layer disposed on the surface of said laminate structure, and
a shield member disposed on the surface of said substrate to cover the outer surface side of this protective layer and said laminate structure,
wherein said protective layer possesses plural layers, and
the lowest layer of said plural layers is an electric insulating compound layer,
wherein said protective layer has a thickness of about 3 microns to about 30 microns.

26. An organic electroluminescence element comprising
a substrate,
a laminate structure disposed on the upper side of said substrate, including an anode, an organic thin film layer having a light emitting function, and a cathode, and
a protective layer disposed on the surface of said substrate, so as to cover the outer surface side of said laminate structure,
wherein said protective layer is formed of a substance for suppressing penetration of moisture and oxygen, and
said protective layer suppresses penetration of said moisture and said oxygen into said laminate structure,
wherein said protective layer possesses plural layers, and
the lowest layer of said plural layers is an electric insulating compound layer,
wherein said protective layer has a thickness of about 3 microns to about 30 microns.

27. An organic electroluminescence element comprising:
a substrate,
a laminate structure disposed on the upper side of said substrate, including at least one anode, an organic thin film layer having a light emitting function, and at least one cathode, and
a protective layer disposed on the outer surface of said laminate structure,
wherein said protective layer possesses plural layers, including an electric insulating compound layer and a metal layer disposed on said electric insulating compound layer.

* * * * *